(12) United States Patent
Ono et al.

(10) Patent No.: US 10,199,428 B2
(45) Date of Patent: Feb. 5, 2019

(54) LIGHT-EMITTING DEVICE

(71) Applicant: NICHIA CORPORATION, Anan-shi (JP)

(72) Inventors: Masato Ono, Sagamihara (JP);
Takahiro Oyu, Chiyoda-ku (JP)

(73) Assignee: NICHIA CORPORATION, Anan-shi (JP)

( * ) Notice: Subject to any disclaimer, the term of this patent is extended or adjusted under 35 U.S.C. 154(b) by 136 days.

(21) Appl. No.: 15/364,679

(22) Filed: Nov. 30, 2016

(65) Prior Publication Data

US 2017/0154920 A1 Jun. 1, 2017

(30) Foreign Application Priority Data

Nov. 30, 2015 (JP) .................. 2015-232693
Sep. 9, 2016 (JP) .................. 2016-176875

(51) Int. Cl.

| H01L 27/15 | (2006.01) |
|---|---|
| H05K 1/18 | (2006.01) |
| H01L 33/58 | (2010.01) |
| H01L 25/075 | (2006.01) |
| H01L 33/62 | (2010.01) |
| H01L 33/54 | (2010.01) |
| F21V 5/00 | (2018.01) |

(52) U.S. Cl.
CPC ............ *H01L 27/156* (2013.01); *F21V 5/007* (2013.01); *H01L 33/54* (2013.01); *H01L 33/58* (2013.01); *H01L 33/62* (2013.01); *H05K 1/181* (2013.01); *H01L 25/0753* (2013.01); *H01L 2224/48091* (2013.01); *H05K 2201/10106* (2013.01)

(58) Field of Classification Search
CPC ....... H01L 33/647; H01L 33/58; H01L 33/62; H01L 33/54; H01L 25/075; H01L 25/0753; H01L 27/156; H05K 1/181
See application file for complete search history.

(56) References Cited

U.S. PATENT DOCUMENTS

2006/0163587 A1* 7/2006 Erchak ................ H01L 25/0753
257/82
2007/0295969 A1* 12/2007 Chew .................... H01L 33/642
257/79

(Continued)

FOREIGN PATENT DOCUMENTS

| JP | 08-076697 | 3/1996 |
|---|---|---|
| JP | 2006-344978 | 12/2006 |
| JP | 2007-207895 | 8/2007 |

(Continued)

*Primary Examiner* — Mariceli Santiago
(74) *Attorney, Agent, or Firm* — Mori & Ward, LLP

(57) ABSTRACT

A light-emitting device includes a mounting board, a first wiring, a plurality of light-emitting elements, a first light-transmissive member, and a second wiring. The first wiring includes a plurality of electrodes which are disposed away from each other on the mounting board. The plurality of light-emitting elements is provided on the mounting board and is electrically connected to the first wiring. The first light-transmissive member is disposed above the plurality of light-emitting elements. The second wiring is disposed on a lower surface of the first light-transmissive member and electrically connects between electrodes among the plurality of electrodes of the first wiring.

15 Claims, 17 Drawing Sheets

(56) References Cited

U.S. PATENT DOCUMENTS

2010/0140655 A1\* 6/2010 Shi ..................... H01L 33/507
                                                     257/99
2013/0258663 A1\* 10/2013 Woodgate ................ F21K 9/00
                                                    362/236

FOREIGN PATENT DOCUMENTS

| JP | 2013-069824 | 4/2013 |
|----|-------------|---------|
| JP | 2013-258371 | 12/2013 |

\* cited by examiner

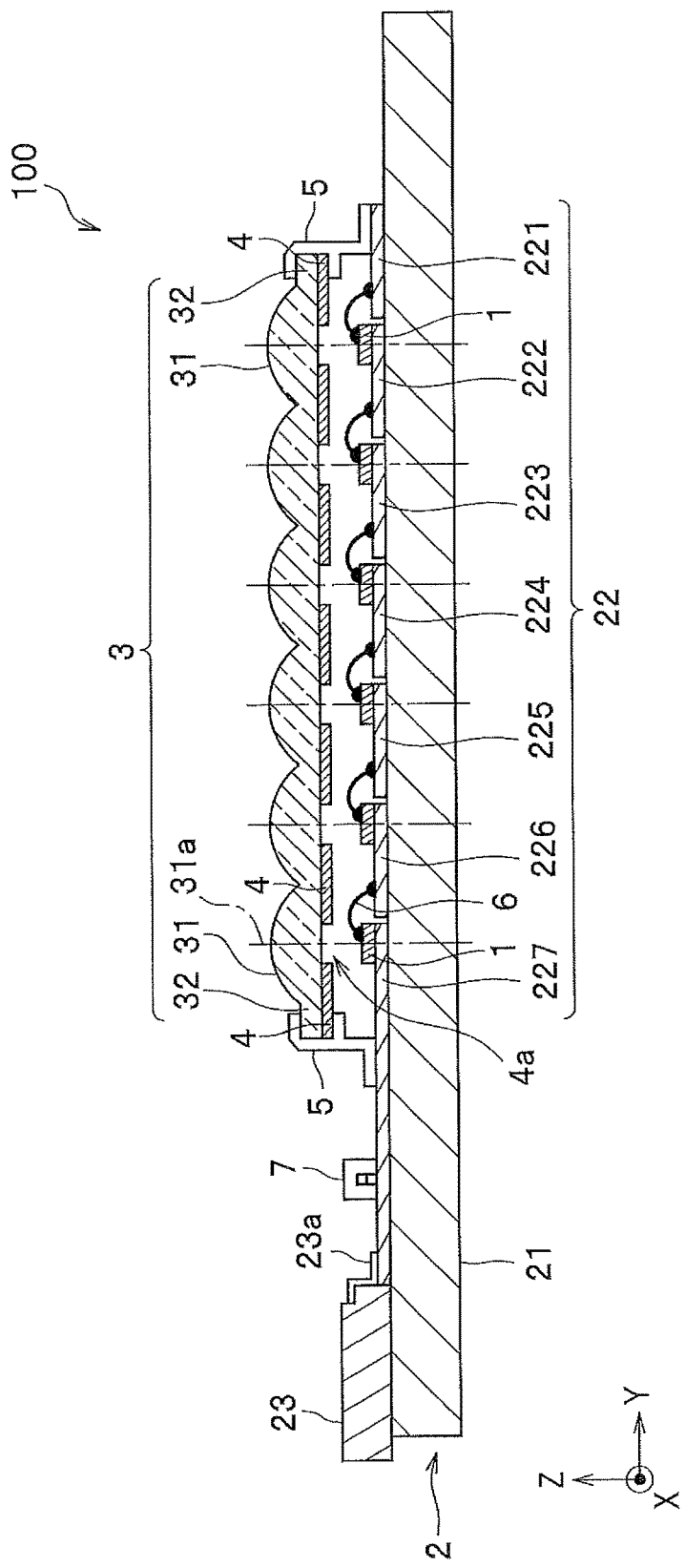

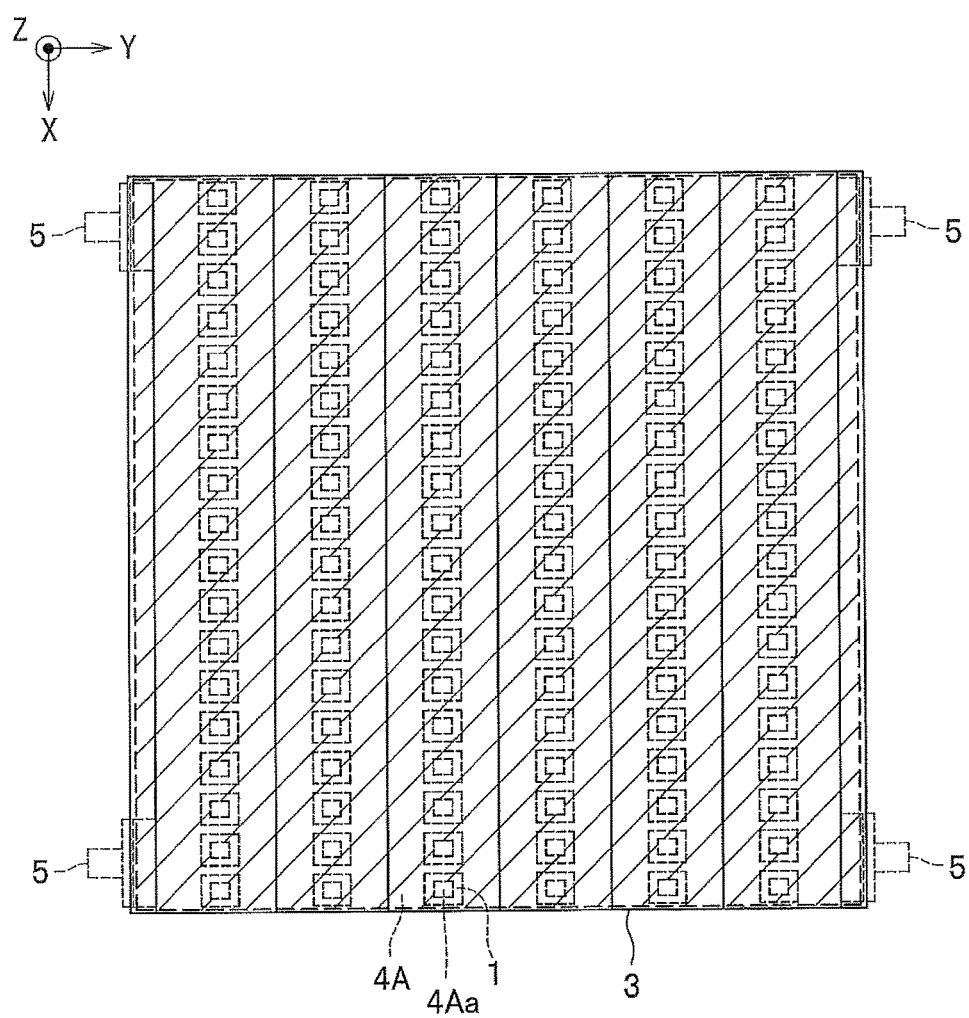

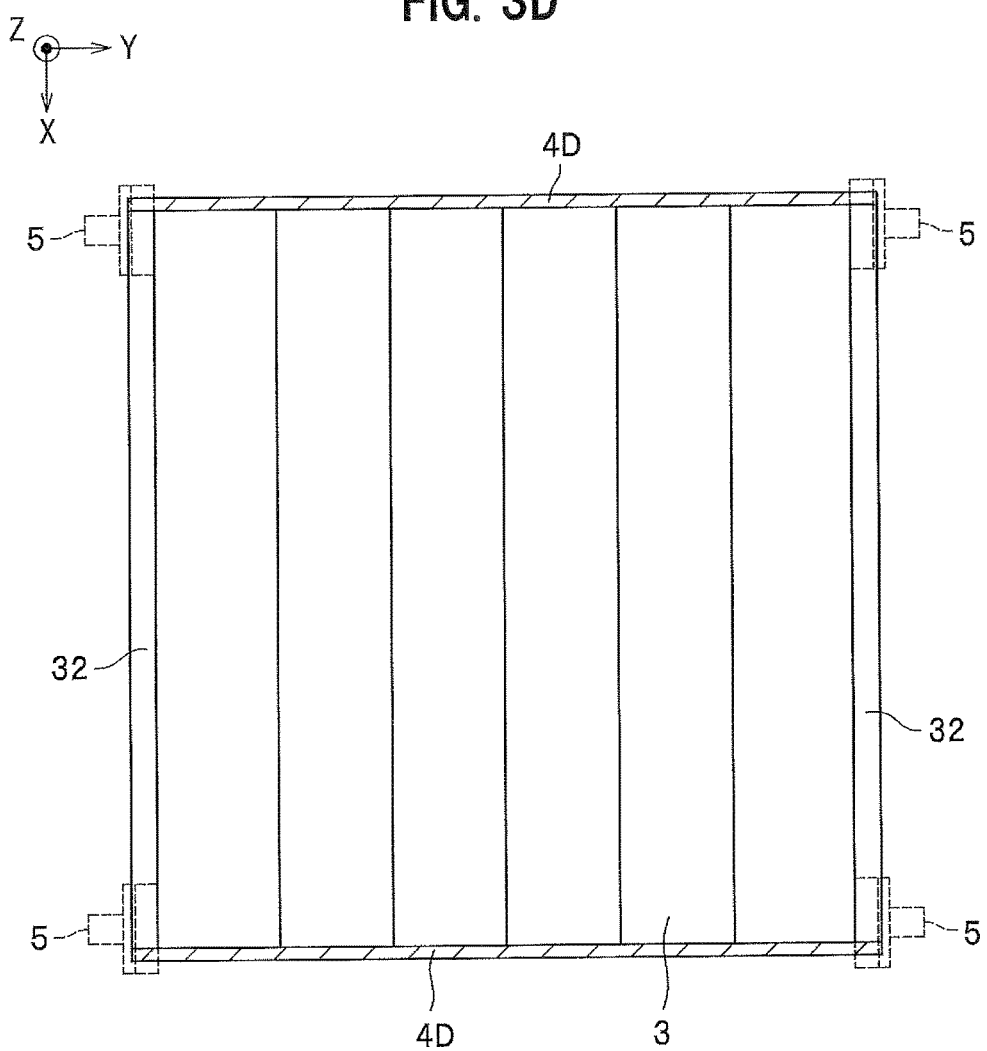

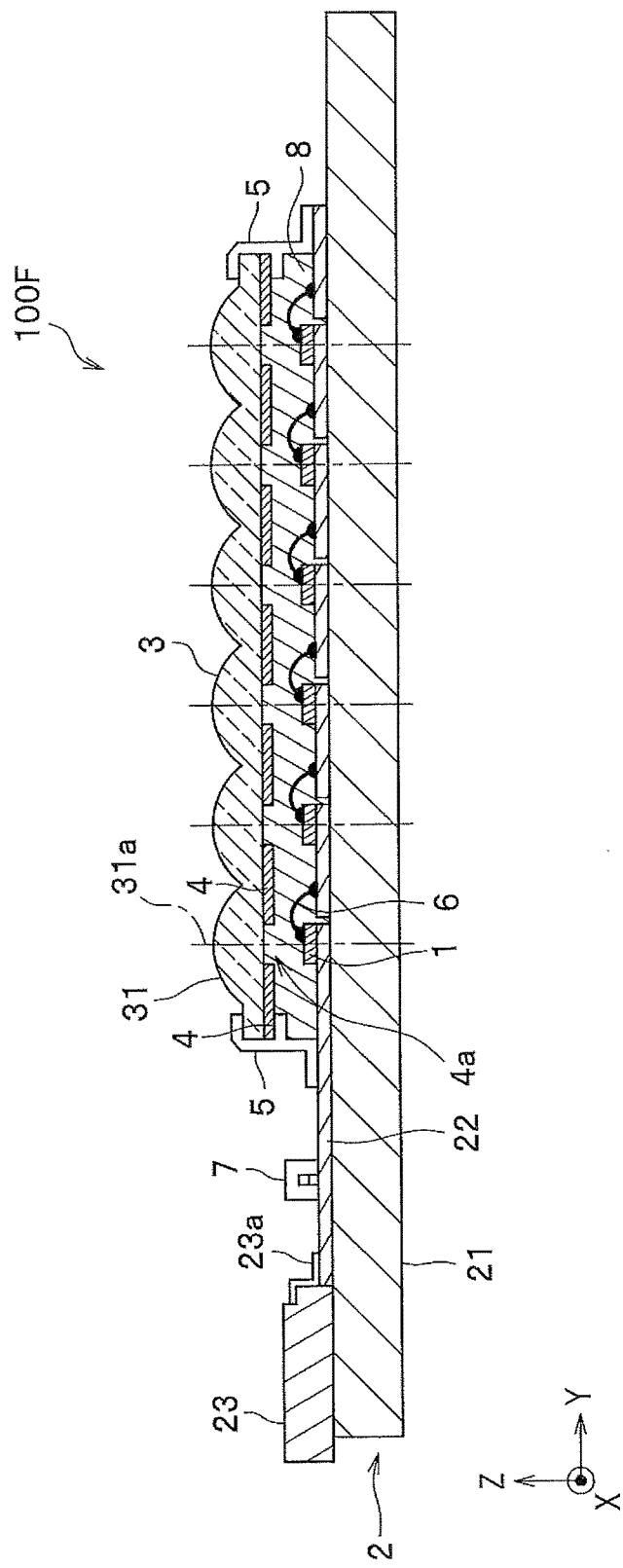

LIGHT-EMITTING DEVICE

CROSS-REFERENCE TO RELATED APPLICATIONS

This application claims priority under 35 U.S.C. § 119 to Japanese Patent Application No. 2015-232693, filed on Nov. 30, 2015, and Japanese Patent Application No. 2016-176875, filed on Sep. 9, 2016. The contents of these applications are incorporated herein by reference in its entirety.

BACKGROUND

Technical Field

The present disclosure relates to a light-emitting device.

Discussion of the Background

Various Chip-on-Board (COB) light-emitting devices each including a plurality of light-emitting elements on its board are being developed in recent years (for example, Japanese Unexamined Patent Application Publication No. 2013-69824). In the COB light-emitting devices, wiring is disposed on the boards and electrically connected to the light-emitting elements. Also, disposing a plurality of light-emitting elements on the board enables the COB light-emitting device to provide a high light output.

In COB light-emitting devices as disclosed in Japanese Unexamined Patent Application Publication No. 2013-69824, to obtain an even higher output, it is necessary that light-emitting elements are arranged at narrow pitches or that sufficient creepage distances be secured when a plurality of light-emitting devices are used in a parallel arrangement. Thus, it is difficult to secure areas for wiring on boards when the light-emitting elements are disposed to the edges of the boards. To address the difficulty, it is conceivable to use multi-layer wiring boards as mounting boards, for example. Use of the multi-layer wiring boards, however, worsens the heat dissipation performance because insulating materials having comparatively low thermal conductivities are used between the layers of the multi-layer wiring. Accordingly, the multi-layer wiring boards are unsuitable for the COB light-emitting devices in which a plurality of light-emitting elements generate a large amount of heat.

An embodiment according to the present disclosure has an object to provide a light-emitting device in which a plurality of light-emitting elements can be disposed densely.

SUMMARY

According to one aspect of the present disclosure, a light-emitting device includes a mounting board, a first wiring, a plurality of light-emitting elements, a first light-transmissive member, and a second wiring. The first wiring includes a plurality of electrodes which are disposed away from each other on the mounting board. The plurality of light-emitting elements is provided on the mounting board and is electrically connected to the first wiring. The first light-transmissive member is disposed above the plurality of light-emitting elements. The second wiring is disposed on a lower surface of the first light-transmissive member and electrically connects between electrodes among the plurality of electrodes of the first wiring.

According to another aspect of the present disclosure, a light-emitting device includes a mounting board, a first wiring, a plurality of light-emitting elements, a first light-transmissive member, and a second wiring. The first wiring includes a plurality of electrodes which are disposed away from each other on the mounting board. The plurality of light-emitting elements is provided on the mounting board and is electrically connected to the first wiring. The first light-transmissive member is disposed above the plurality of light-emitting elements. The second wiring is disposed on one or more lateral surfaces of the first light-transmissive member and electrically connects between electrodes among the plurality of electrodes of the first wiring.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

FIG. 2C is a schematic cross-sectional diagram illustrating the constitution of the light-emitting device according to the first embodiment taken along the line IIC-IIC in FIG. 1.

FIG. 3A is a schematic plan diagram illustrating a first modification of second wiring in the light-emitting device according to the first embodiment.

FIG. 3D is a schematic plan diagram illustrating a fourth modification of the second wiring in the light-emitting device according to the first embodiment.

FIG. 5A is a schematic cross-sectional diagram illustrating a constitution of a light-emitting device according to a second embodiment.

DETAILED DESCRIPTION OF EMBODIMENTS

Figure 1:
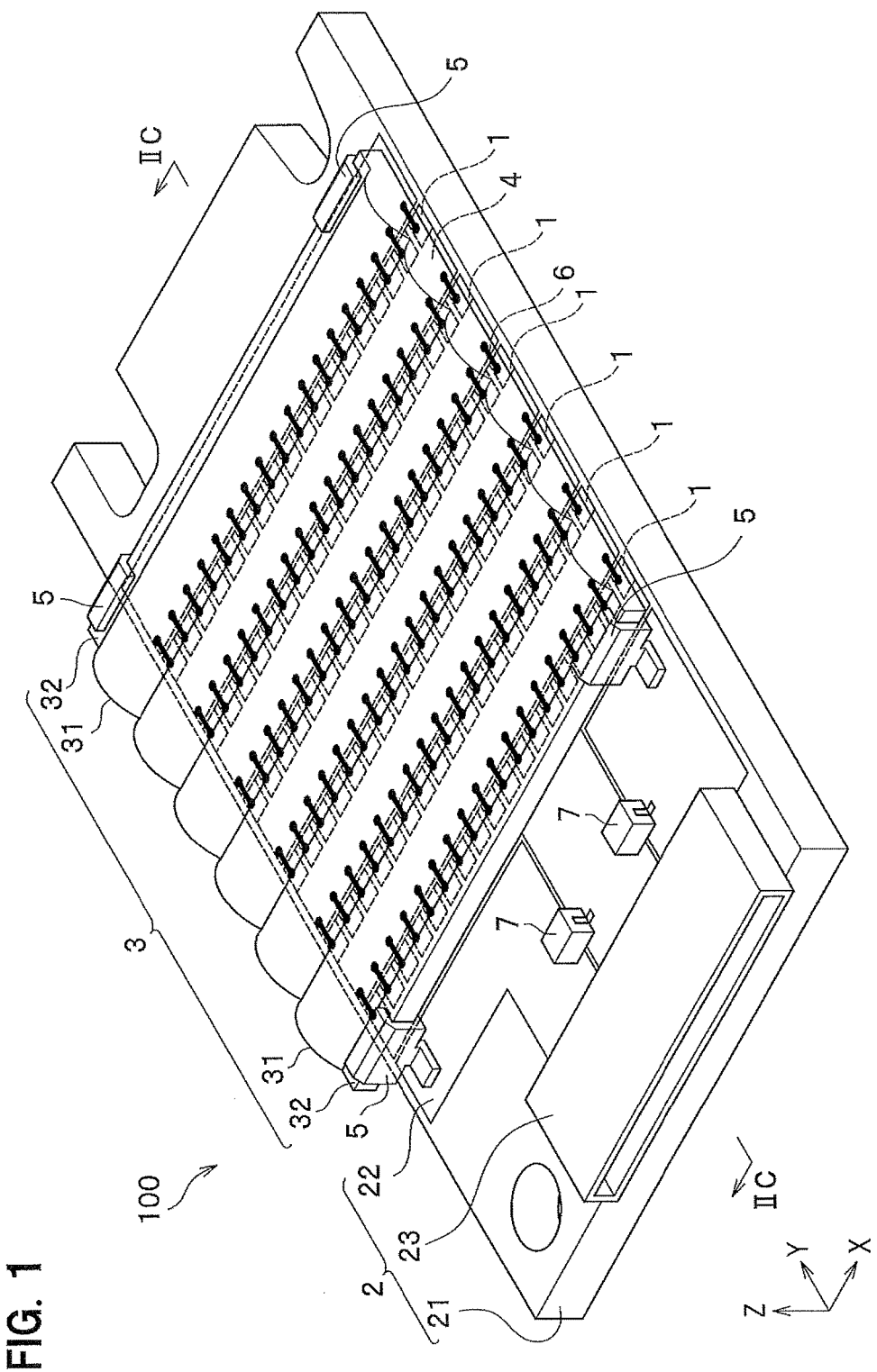
FIG. 1 is a schematic perspective diagram illustrating a constitution of a light-emitting device according to a first embodiment.

The embodiments will now be described with reference to the accompanying drawings, wherein like reference numerals designate corresponding or identical elements throughout the various drawings.

The following describes light-emitting devices according to embodiments.

The drawings referred to in the descriptions below schematically illustrate the embodiments. The scales, the distances, the positional relations, and the like of members may be exaggerated, or illustration of part of the members may be omitted in some cases. Also, the scales or the distances of the members in a plan view may not be the same as the scales or the distances in a cross-sectional view. In the descriptions below, the same term or reference number represents the same or homogenous member in principle, and its detailed description will be omitted as appropriate.

For ease of illustration, directions of observation are represented by the XYZ coordinate system in each drawing.

Herein, the coordinate axes are defined so that a surface of a mounting board on which light-emitting elements are mounted will be an upper surface parallel to an X-Y plane, and the upward direction will be a plus direction in the Z axis.

The constitution of any of the embodiments and modifications to be described below can apply to other embodiments and modifications.

First Embodiment

[Constitution of Light-Emitting Device]

A constitution of a light-emitting device according to a first embodiment will be described referring to FIG. 1 to FIG. 2C.

Figure 2A:
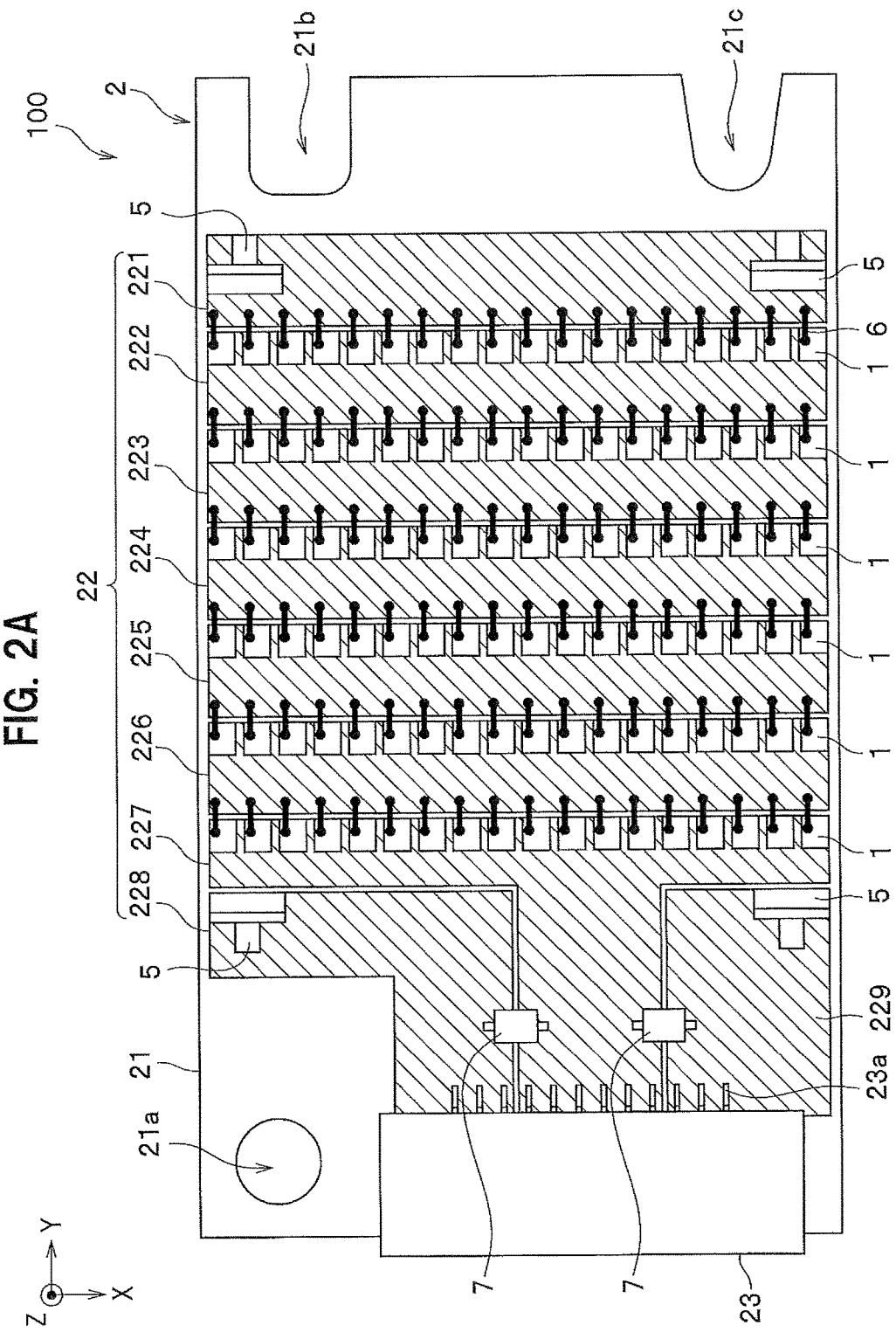
FIG. 2A is a schematic plan diagram illustrating the constitution of the light-emitting device according to the first embodiment without a first light-transmissive member.
Figure 2B:
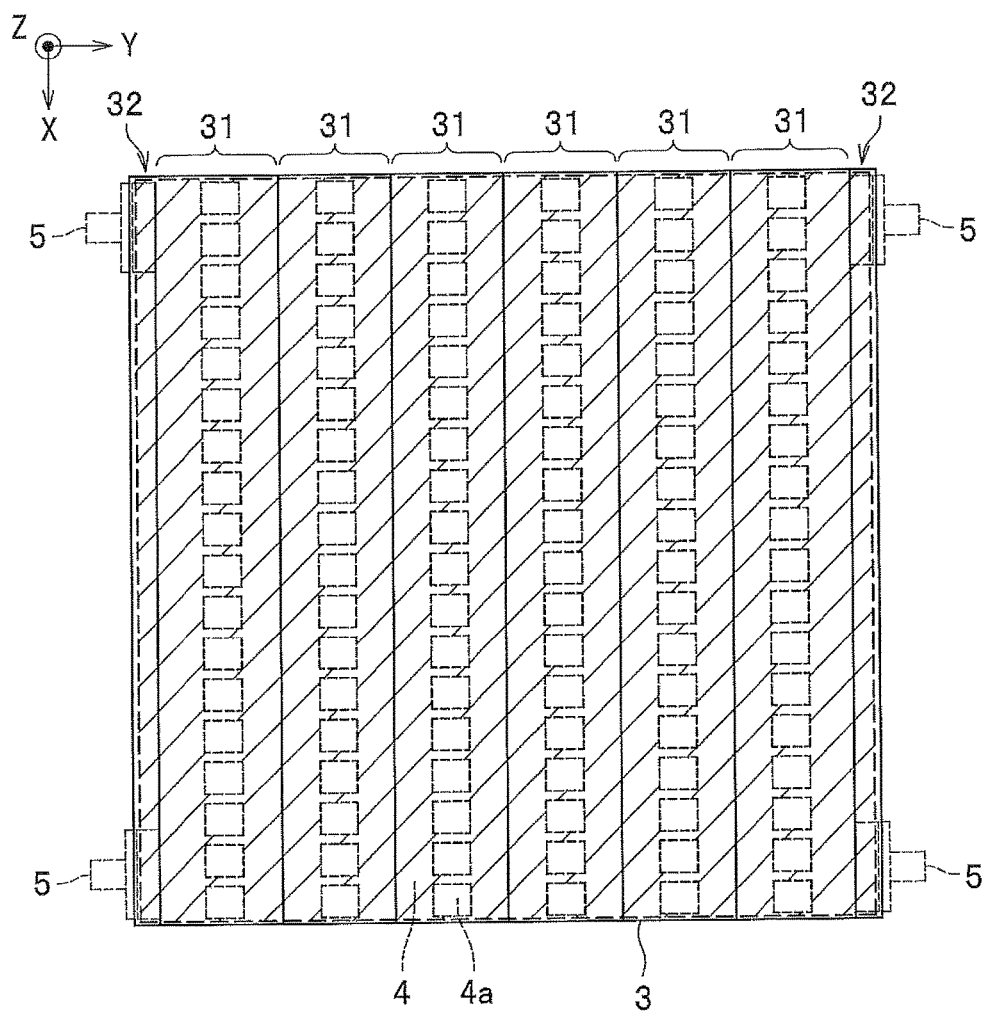
FIG. 2B is a schematic plan diagram illustrating a constitution of the first light-transmissive member in the light-emitting device according to the first embodiment.

FIG. 2A and FIG. 2B are plan diagrams. In FIG. 2A, hatched areas represent first wiring. In FIG. 2B, hatched areas represent second wiring.

A light-emitting device 100 according to the present embodiment includes, as main constituent members, a mounting board 2, a plurality of light-emitting elements 1 mounted on the upper surface of the mounting board 2, and a plate-like first light-transmissive member 3 having second wiring 4 on its lower side. In the mounting board 2, a first wiring 22 is disposed on an upper surface of a base 21 having an approximately rectangular shape in a plan view. The first light-transmissive member 3 covers, from above, the area on which the light-emitting elements 1 are mounted.

The light-emitting elements 1 are electrically connected by the first wiring 22 and the second wiring 4 and emit light by electrical power supply through a connector, i.e., supply terminal, 23 on one end of the mounting board 2. The first light-transmissive member 3 is attached to the mounting board 2 with supporting members 5. The first wiring 22 is electrically connected to the second wiring 4 through the supporting members 5. Protective elements 7 are disposed on the mounting board 2.

The gap between the mounting board 2 and the first light-transmissive member 3 is an air layer. A light-transmissive member may be disposed in the gap to cover, preferably encapsulate, the light-emitting elements 1. When the gap between the mounting board 2 and the first light-transmissive member 3 is an air layer, it is preferable that the mounting board 2 and the first light-transmissive member 3 are not completely sealed and that the light-emitting device 100 is not airtight.

With this constitution, even if a small amount of water is present in the light-emitting device 100, the heat applied at the time of joining and drying the mounting board 2 and the first light-transmissive member 3 can vaporize the water, and the vaporized moisture can be discharged to the outside through the gap between the mounting board 2 and the first light-transmissive member 3. Thus, this constitution can reduce a risk that metal wiring or other components of the mounting board 2 is corroded by water, keeping the light-emitting device reliable.

The constitution of each component is described in detail below.

The mounting board 2 includes the plate-like base 21 having an approximately rectangular shape in a plan view, the first wiring 22 provided on the upper surface of the base 21, and the connector 23 provided on one end in the Y-axis direction of the upper surface of the base 21.

The base 21 may be formed of an insulating material such as ceramics and resins, a metal plate having a surface on which an insulating film is disposed, or other materials. On three corners of the base 21 in a rectangular shape in a plan view, a through hole 21a and notches 21b and 21c are formed to use for attaching the device to a mount of an application product such as a light source unit by screwing.

Preferably, metals such as Cu and Al having good electrical and thermal conductivities can be used for the first wiring 22. A plurality of electrodes disposed away from one another constitute the first wiring 22. Specifically, the first wiring 22 includes long electrodes 221 to 227 extending in the X-axis direction and electrodes 228 and 229 facing each other and each disposed above and below the electrode 227 in the X-axis direction. These electrodes 221 to 229 are disposed away from one another. The electrodes 221 to 227 each have approximately the same length as the overall length of the base 21 in the X-axis direction. Also, the electrodes 227 to 229 extend toward the connector 23 on one end of a shorter side of the base 21 while disposed away from one another. The electrodes 227 to 229 are electrically connected to corresponding electrodes 23a of the connector 23.

For example, the electrode 227 is connected to electrodes 23a on the positive electrode (anode) side, and the electrodes 228 and 229 are connected to electrodes 23a on the negative electrode (cathode) side.

On each of the electrodes 222 to 227, eighteen light-emitting elements 1 are aligned in a row in the X-axis direction. Element electrodes on the lower side of these light-emitting elements 1 are connected to the electrodes 222 to 227 using electrically-conductive connecting members such as solder, and element electrodes on the upper side are electrically connected to adjacent electrodes 221 to 226 using wires 6. Accordingly, the light-emitting elements 1 on the same one of the electrodes 222 to 227 are electrically connected to one another in parallel, and the light-emitting elements 1 on different electrodes 222 to 227 are electrically connected to one another in series.

The electrically-conductive supporting members 5 are disposed on each of the electrodes 228 and 229, which are disposed on one end in the Y-axis direction of the first wiring 22, and the electrode 221, which is disposed on the other end of the first wiring 22.

Also, as predetermined electrodes in the first wiring 22, the electrode 221 is electrically connected to the electrodes 228 and 229 via the second wiring 4. Specifically, the electrode 221 is electrically connected to the electrodes 228 and 229 via the supporting members 5 on the electrode 221, the second wiring 4 on the lower surface of the first light-transmissive member 3, and the supporting members 5 on the electrodes 228 and 229.

Also, the protective elements 7 are each disposed between the electrode 227 and the electrode 228 and between the electrode 227 and the electrode 229.

The connector (supply terminal) 23 is a terminal for connecting the device to an external power supply and for supplying electricity to a circuit constituted of the first wiring 22, the supporting members 5, the light-emitting elements 1, the wires 6, and the second wiring 4. A shape of the connector 23 can be appropriately selected.

Alternatively, as a supply terminal, the electrodes 227 to 229 may each have a pad area for connecting a lead wire, for example by soldering, instead of the connector 23.

The connector 23 in the present embodiment includes positive and negative supply terminals, but a connector as a supply terminal on the positive electrode side and a connector as a supply terminal on the negative electrode side may be disposed separately.

Alternatively, the connector 23 may be located at a position adjacent to the first light-transmissive member 3 so that not only the first wiring 22 but the second wiring 4 will be directly connected to corresponding electrodes 23a of the connector 23.

Also, when the light-emitting elements 1 aligned in one direction (e.g., Y-axis direction) are connected in series as in the present embodiment, to dispose positive and negative supply terminals on one end of the mounting board 2 in the direction of alignment, it is necessary to dispose wiring from the one end toward the other end. When the light-emitting elements 1 are densely arranged in the direction (e.g., X-axis direction) substantially perpendicular to the one direction in a plan view, it is difficult to dispose the wiring between the light-emitting elements 1 on the upper surface of the mounting board 2. In the present embodiment, the second wiring 4 for connecting the one end to the other end of the mounting board 2 is disposed on the first light-transmissive member 3 covering the light-emitting elements 1 from above. Thus, the light-emitting elements 1 can be disposed densely.

Also, since the connector 23 including positive and negative supply terminals is disposed at one position, wiring for connecting the device to an external power supply can be collected on one end of the mounting board 2. This constitution facilitates attachment of the light-emitting device 100 to an application product such as a light source unit.

The light-emitting elements 1 are mounted on the upper surface of the mounting board 2 to form a two-dimensional (e.g., the X-axis direction and the Y-axis direction) array. In the present embodiment, eighteen elements are disposed in the X-axis direction, and six elements are disposed in the Y-axis direction. The light-emitting elements 1 have element electrodes of different polarities respectively on the lower surface and the upper surface. Using electrically-conductive bonding members such as solder, the element electrodes on the lower side are, electrically and mechanically connected to the first wiring 22 on which the light-emitting elements 1 are disposed. The element electrodes on the upper side are electrically connected to the adjacent first wiring 22 using the wires 6. For example, the element electrodes on the lower side of the light-emitting elements 1 on the electrode 222 are connected to the electrode 222 using the electrically-conductive bonding members, and the element electrodes on the upper side are connected to the electrode 221 using the wires 6.

The element rows each constituted of eighteen light-emitting elements 1 aligned in the X-axis direction are disposed on the upper surfaces of the respective electrodes 222 to 227, and the light-emitting elements 1 are electrically connected in parallel. Also, each row of six light-emitting elements 1 aligned in the Y-axis direction are respectively disposed on the different electrodes 222 to 227 and are electrically connected to one another in series.

Since the electrode 221 is electrically connected to the electrodes 228 and 229 via the supporting members 5 and the second wiring 4 as described above, applying a voltage between the electrode 227 and the electrodes 228 and 229 can make all the light-emitting elements 1 to emit light.

The light-emitting elements 1 can have a constitution in which the positive and negative element electrodes are separately disposed on the upper and lower sides, or the positive and negative element electrodes may be disposed on one side. When the positive and negative element electrodes of the light-emitting elements 1 are disposed on the lower side, the light-emitting elements 1 can be mounted using the flip-chip method between a pair of adjacent electrodes among the electrodes 221 to 227. Alternatively, when the positive and negative element electrodes of the light-emitting elements 1 are disposed on the upper side, the lower side can be die-bonded to one of a pair of adjacent electrodes among the electrodes 221 to 227, and the positive and negative element electrodes on the upper side can be electrically connected to respective electrodes having corresponding polarities using wires.

Semiconductor light-emitting elements including semiconductor stacked bodies having light-emitting structures such as LEDs (light-emitting diodes) can be used for the light-emitting elements 1.

Materials suitable for semiconductor light-emitting elements, such as GaN, GaAs, and AlInGaP, can be used for the semiconductor stacked bodies. In particular, GaN compound semiconductors represented by $In_XAl_YGa_{1-X-Y}N$ ($0 \leq X$, $0 \leq Y$, $X+Y<1$), which can emit light having wavelengths in the visible or near-ultraviolet range, can be preferably used.

The first light-transmissive member 3 is a cover member that covers from above the overall area on which the light-emitting elements 1 are disposed and is attached to the mounting board 2 using four electrically-conductive supporting members 5. Also, the second wiring 4 is disposed on the lower side of the first light-transmissive member 3 to conduct electricity between the supporting members 5 on both ends in the Y-axis direction.

The first light-transmissive member 3 in the present embodiment includes, on the upper side, six semicylindrical lenses 31 extending in one direction (e.g., X-axis direction) in a plurality of rows. Also, both ends of the first light-transmissive member 3 in the Y-axis direction have flat portions 32, and the upper and lower surfaces of the flat portions 32 are pinched by the supporting members 5.

Insulating light-transmissive materials such as glass and resins may be used for the first light-transmissive member 3. The first light-transmissive member 3 preferably transmits equal to or more than 60%, more preferably equal to or more than 90%, of the light from the light-emitting elements 1. Thus, the light from the light-emitting elements 1 can be efficiently extracted through the first light-transmissive member 3.

The lenses 31 are disposed for adjustment of light distribution properties of the light-emitting elements 1. The semicylindrical lenses 31 correspond to each of the element rows of the light-emitting elements 1 aligned in the X-axis direction.

Preferably, the lenses 31 extend along axes approximately parallel to the direction of alignment of the light-emitting elements 1 so that the optical axes 31a of the lenses 31 will coincide with the optical axes of the corresponding light-emitting elements 1, in other words, coincide with the axes located at the centers of the widths in the Y-axis direction of the light-emitting elements 1. In this case, the term "optical axis" of one of the light-emitting elements 1 means a straight line that passes through the center of the light-emitting element 1 substantially perpendicularly to the light emission surface. The term "coincide" includes the case where the gap between the optical axis of one of the lenses 31 and the optical axis of the light-emitting element 1 is less than 50 µm, preferably less than 10 µm, in addition to the case where the optical axes completely coincide with each other. In the height direction (i.e., Z-axis direction), it is preferable that the focuses of the lenses 31 coincide with the upper surfaces of the light-emitting elements 1. This constitution enables the light distribution properties of the light-emitting elements 1 to be well adjusted.

The first light-transmissive member 3 may be a plate-like shape without the lenses 31.

The second wiring 4 is a wiring pattern on the lower surface of the first light-transmissive member 3. The second wiring 4 is disposed for electrically connecting the electrode 221 to the electrodes 228 and 229 via the supporting members 5.

In a plan view, the second wiring 4 is more preferably disposed, away from the optical axes of the light-emitting elements 1 and away from areas overlapping areas on which the light-emitting elements 1 are disposed, in the state where the first light-transmissive member 3 is attached to the mounting board 2. For this reason, the second wiring 4 in the present embodiment has openings 4a in the areas overlapping the areas on which the light-emitting elements 1 are disposed when viewed from above. Thus, the light from the light-emitting elements 1 can be efficiently emitted to the outside through the first light-transmissive member 3.

The second wiring 4 is preferably made of a light-transmissive electrically-conductive material to enhance the light extraction efficiency, but can be made of an electrically-conductive material with less-light-transmissive property to keep the electrical resistance low depending on the condition. In particular, when the areas of the openings 4a are small compared with the areas of the light-emitting elements 1 in a plan view, the second wiring 4 is preferably formed of a light-transmissive electrically-conductive material.

Examples of the electrically-conductive material with less-light-transmissive property used for the second wiring 4 include metals such as Cu, Al, and Au and alloys mainly including these metals. When metal materials are used, the second wiring 4 can be formed on the lower surface of the first light-transmissive member 3 by, for example, sputtering or plating. Alternatively, the second wiring 4 may be formed to the lower surface of the first light-transmissive member 3 with a metal plate or a metal foil patterned by, for example, punching or etching.

Also, examples of the light-transmissive electrically-conductive material used for the second wiring 4 include metal films and electrically-conductive metal oxides. Examples of the electrically-conductive metal oxides include oxides containing at least one element selected from the group consisting of Zn, In, Sn, Ga, and Ti. Specifically, the examples of the electrically-conductive metal oxides include ZnO, AZO (Al-doped ZnO), IZO (In-doped ZnO), GZO (Ga-doped ZnO), $In_2O_3$, ITO (Sn-doped $In_2O_3$), IFO (F-doped $In_2O_3$), $SnO_2$, ATO (Sb-doped $SnO_2$), FTO (F-doped $SnO_2$), CTO (Cd-doped $SnO_2$), and $TiO_2$. Among these oxides, ITO is a preferable material for the second wiring 4 because ITO has a high visible light transmittance and a high electrical conductivity.

When such a material is used, the second wiring 4 can be formed by forming a film on the lower surface of the first light-transmissive member 3 by sputtering or other methods, and then patterning the film by lift-off or etching with a mask formed by photolithography, for example.

The supporting members 5 are disposed on the electrode 221 and the electrodes 228 and 229, which are located at both ends in the Y-axis direction of the first wiring 22 on the upper surface of the mounting board 2. The supporting members 5 are used for attaching the first light-transmissive member 3 to the mounting board 2. The supporting members 5 are formed of a metal material such as Cu and Al, and electrically and mechanically connected onto the electrode 221 and the electrodes 228 and 229 using electrically-conductive connecting members such as solder. The supporting members 5 pinch the flat portions 32 of the first light-transmissive member 3 in the vertical direction (Z-axis direction) and are electrically connected to the second wiring 4, which is disposed on the lower surface of the first light-transmissive member 3, at the portions where the first light-transmissive member 3 is pinched.

To electrically connect one end to the other end in the Y-axis direction via the second wiring 4, at least one supporting member 5 is necessitated for each end.

Also, instead of the supporting members 5, both ends of the first light-transmissive member 3 in the Y-axis direction may be formed to extend downward and may be joined to the mounting board 2. In this case, the second wiring 4 may be directly joined to corresponding electrodes of the first wiring 22.

The wires 6 are wiring for electrically connecting the light-emitting elements 1 to the first wiring 22. Metal wires, such as Au, Cu, and Al, used for wire bonding can be used for the wires 6.

It is preferable to dispose the protective elements 7 to protect the light-emitting elements 1 from overvoltage. Zener diodes can be preferably used for the protective elements 7. Varistors, capacitors, or other devices can also be used.

In the present embodiment, the protective elements 7 are disposed between the electrode 227 and the electrode 228, and between the electrode 227 and the electrode 229.

[Operation of Light-Emitting Device]

Operation of the light-emitting device 100 according to the first embodiment will be described referring to FIG. 1 to FIG. 2C. The case where the second wiring 4 is light transmissive will be described.

If an external power supply is connected to the connector 23 of the light-emitting device 100, electricity is supplied to the circuit constituted of the light-emitting elements 1, the first wiring 22, the supporting members 5, the wires 6, and the second wiring 4, thereby allowing the light-emitting elements 1 to emit light. The light emitted from the light-emitting elements 1 is extracted from the light-emitting device 100 through the second wiring 4 and the first light-transmissive member 3. In this case, since the second wiring 4 has the openings 4a directly above the light-emitting elements 1, the light entering the openings 4a will be well emitted to the outside.

Also, the lenses 31 of the first light-transmissive member 3 adjust the light distribution properties of the light emitted from the light-emitting elements 1 before the light is output from the light-emitting device 100.

[Method for Manufacturing Light-Emitting Device]

A method for manufacturing the light-emitting device 100 according to the first embodiment will be described referring to FIG. 1 to FIG. 2C.

The method for manufacturing the light-emitting device 100 includes a step of providing a mounting board, a step of providing a first light-transmissive member, a step of mounting light-emitting elements, and a step of attaching the first light-transmissive member.

At the step of providing a mounting board, the mounting board 2 is provided. The mounting board 2 can be formed, for example by a method similar to a method for manufacturing a printed board, using the first wiring 22 formed on the upper surface of the plate-like base 21 having the through hole 21a and the notches 21b and 21c, and the connector 23 connected to the base 21 by soldering or other methods.

At the step of providing a first light-transmissive member, the first light-transmissive member 3 with the second wiring 4 on the lower surface is provided. The first light-transmissive member 3 can be formed, for example using glass, by injection molding, compression molding, transfer molding, or the like.

The second wiring 4 can be formed on the lower side of the first light-transmissive member 3 by sputtering using a light-transmissive electrically-conductive material such as ITO.

At the step of mounting light-emitting elements, the light-emitting elements 1 are mounted on the mounting board 2. First, each of the light-emitting elements 1 is die-bonded to predetermined one of the electrodes 222 to 227 of the first wiring 22 using an electrically-conductive connecting member such as solder so that each of the lower surfaces having an electrode of one polarity faces the first wiring 22.

Subsequently, an electrode of the other polarity on the upper surface of the light-emitting element 1 is electrically connected to corresponding one of the electrodes 221 to 226 of the first wiring 22 using the wire 6. The light-emitting elements 1 are thus mounted on the mounting board 2.

At the step of attaching the first light-transmissive member, the first light-transmissive member 3 with the second wiring 4 on the lower surface is adhered to the mounting board 2.

At this step, the supporting members 5 are first attached so that the supporting members 5 pinches the flat portions 32 of the first light-transmissive member 3. The supporting members 5 can be formed by sheet-metal processing such as pressing. The supporting members 5 can be attached to the first light-transmissive member 3 by clamping.

Subsequently, the supporting members 5 are jointed to the first wiring 22 using electrically-conductive connecting members such as solder. Accordingly, the first light-transmissive member 3 can be attached to the mounting board 2.

Performing the above steps enables the light-emitting device 100 to be manufactured.

MODIFICATIONS

Modifications of members in the light-emitting device 100 according to the first embodiment will be described.

[Modifications of Second Wiring]

Modifications of the second wiring will be described referring to FIG. 3A to FIG. 3E.

Figure 3B:
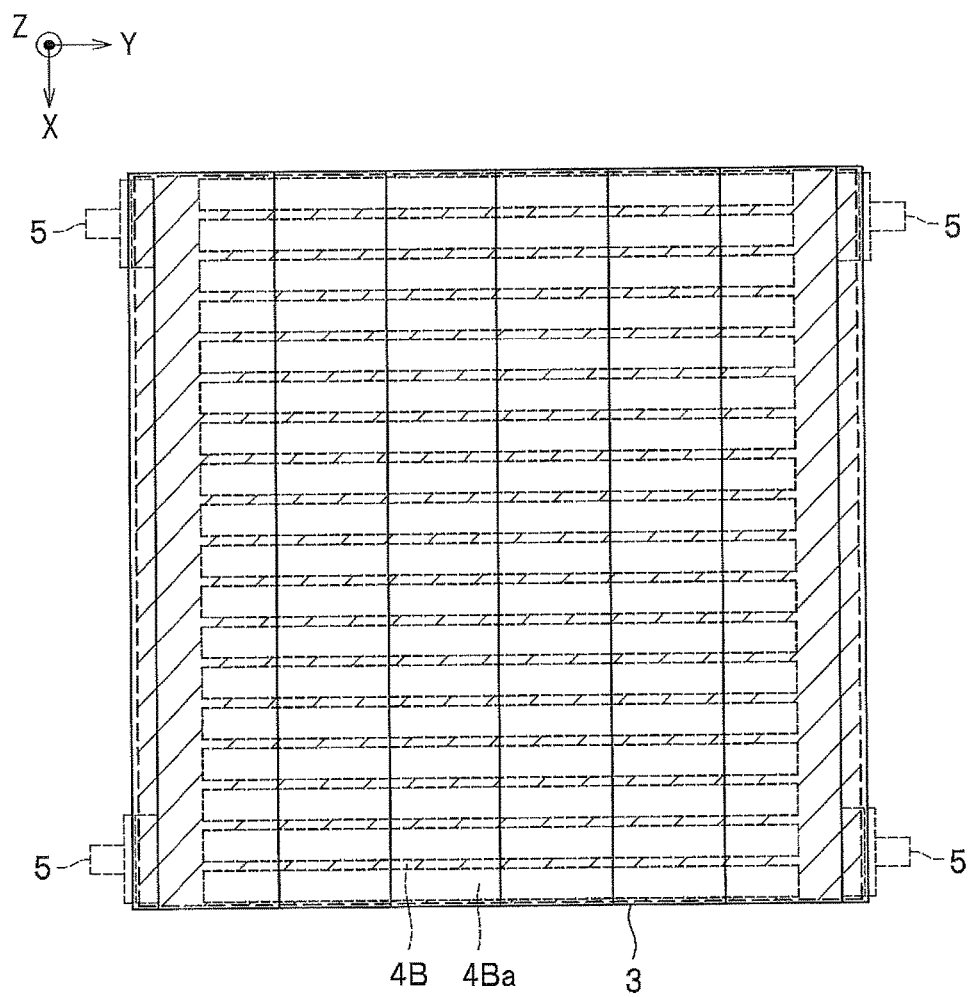
FIG. 3B is a schematic plan diagram illustrating a second modification of the second wiring in the light-emitting device according to the first embodiment.

FIG. 3A to FIG. 3E are plan diagrams. Hatched areas represent the second wiring. In FIG. 3A, the sizes and the positions of the light-emitting elements 1 are indicated by dashed lines for reference.

First Modification

Second wiring 4A according to a first modification shown in FIG. 3A has openings 4Aa above the areas on and adjacent to the optical axes of the light emitting elements 1, in other words, the centers and their periphery in a plan view of the light-emitting elements 1. Disposing the openings 4Aa above the areas on and adjacent to the optical axes, which receive a particularly large amount of light from the light-emitting elements 1, reduces the amount of losses of the light due to absorption and reflection of light by the second wiring 4A and enables the effective width of the second wiring 4A in the X-axis direction to be larger, thereby reducing the wiring resistance. Accordingly, the wiring width of the second wiring 4A is less likely to be too small, and a good electrical conductivity can be ensured even when the light-emitting elements 1 are disposed particularly densely in the X-axis direction.

The widths of the openings 4Aa are only required to be smaller than the widths of the light-emitting elements 1 and are preferably equal to or more than ¼ of the widths of the light-emitting elements 1, for example. By employing such widths, the light from the light-emitting elements 1 can be well extracted to the outside through the first light-transmissive member 3.

Second Modification

With respect to the X-axis direction, second wiring 4B according to a second modification shown in FIG. 3B has openings 4Ba above the areas on which the light-emitting elements 1 are disposed. Accordingly, the second wiring 4B has a striped wiring pattern extending in the Y-axis direction. With this constitution, the light outputting in the Y-axis direction can be extracted to the outside with less obstruction by the second wiring 4B.

The widths of the openings 4Ba in the X-axis direction may not be the same widths as the light-emitting elements 1 but may be smaller widths including the optical axes of the light-emitting elements 1, as the openings 4Aa of the second wiring 4A in the first modification.

Third Modification

Figure 3C:
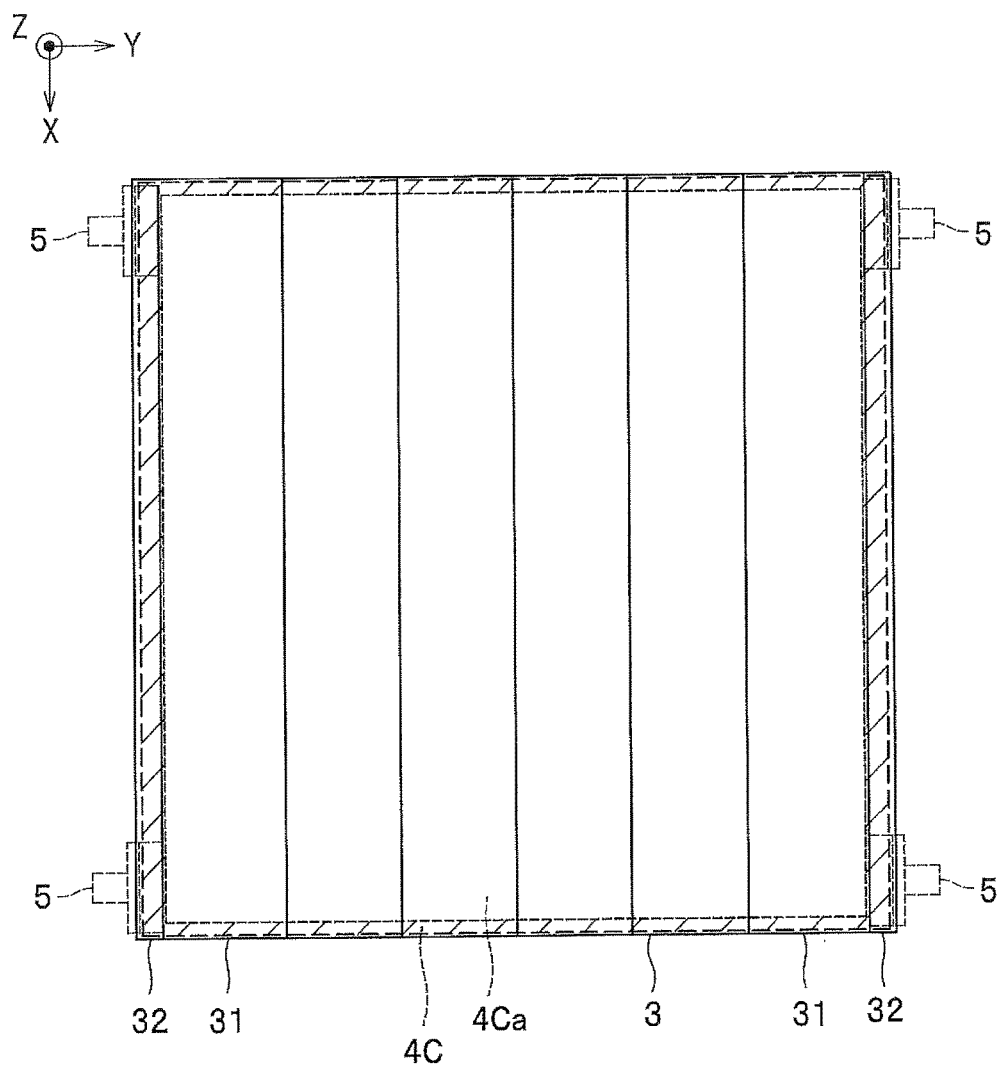
FIG. 3C is a schematic plan diagram illustrating a third modification of the second wiring in the light-emitting device according to the first embodiment.

Second wiring 4C according to a third modification shown in FIG. 3C has an opening 4Ca in a central area, which is a mounting area including areas between chips of the light-emitting elements 1 in a plan view, of the first light-transmissive member 3. In other words, the second wiring 4C is disposed only at the edges, which are out of the area on which the light-emitting elements 1 are mounted, of the lower surface of the first light-transmissive member 3. Accordingly, the light from the light-emitting elements 1 can be emitted to the outside through the first light-transmissive member 3 almost without less obstruction by the second wiring 4C. Also, since the second wiring 4C is disposed at the edges of the area on which the light-emitting elements 1 are mounted, a metal material having a high electrical conductivity can be used to ensure both a good light extraction efficiency and reduction in the wiring resistance.

Fourth Modification

Second wiring 4D according to a fourth modification shown in FIG. 3D is on the lateral surfaces of the first light-transmissive member 3 but not disposed on the lower surface of the first light-transmissive member 3. Accordingly, the light from the light-emitting elements 1 can be extracted to the outside through the first light-transmissive member 3 almost without obstruction by the second wiring 4D. Also, a less-light-transmissive metal material can be used for the second wiring 4D to ensure both a good light extraction efficiency and reduction in the wiring resistance.

In the present modification, the supporting members 5 contact the lateral surfaces in the X-axis direction of the flat portions 32 of the first light-transmissive member 3, so that the supporting members 5 are electrically connected to the second wiring 4D.

Also, in any of the second wiring 4 and 4A to 4C, the same wiring pattern as the second wiring 4D may be added on the lateral surfaces in the X-axis direction of the first light-transmissive member 3. This constitution can reduce the wiring resistance almost without effect to the light extraction.

Fifth Modification

Figure 3E:
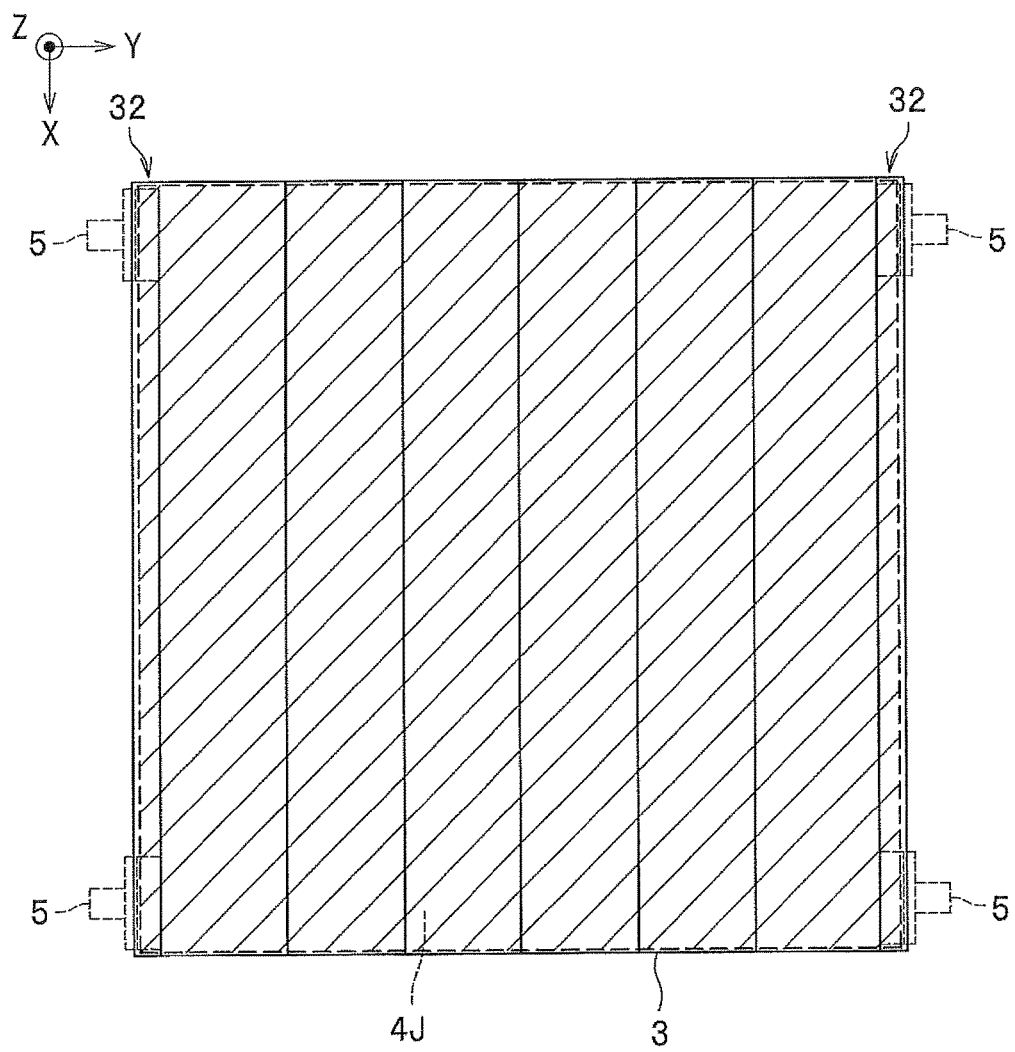
FIG. 3E is a schematic plan diagram illustrating a fifth modification of the second wiring in the light-emitting device according to the first embodiment.

Second wiring 4J according to a fifth modification shown in FIG. 3E covers approximately the entire lower surface of the first light-transmissive member 3. In other words, the second wiring 4J is disposed also above the area including the centers of the light-emitting elements 1 in a plan view without avoiding optical axes of the light-emitting elements 1. Disposing the second wiring 4J without avoiding the optical axes of the light-emitting elements 1 increases losses of the light from the light-emitting elements 1 due to absorption and reflection by the second wiring 4J, but the wiring resistance of the second wiring 4J can be reduced because the second wiring 4J is disposed on a wide area throughout the lower surface of the first light-transmissive member 3. Accordingly, the efficiency of light emission from the light-emitting device 100 can be enhanced with respect to the input electricity.

Another Modification

For example, the second wiring may be disposed without avoiding the optical axes of the light-emitting elements 1 even when the second wiring has openings as the second wiring 4 shown in FIG. 2B. In other words, the openings of the second wiring may be disposed away from the optical axes of the light-emitting elements 1.

[Modification of First Light-Transmissive Member]

Next, a modification of the first light-transmissive member will be described referring to FIG. 4.

Figure 4:
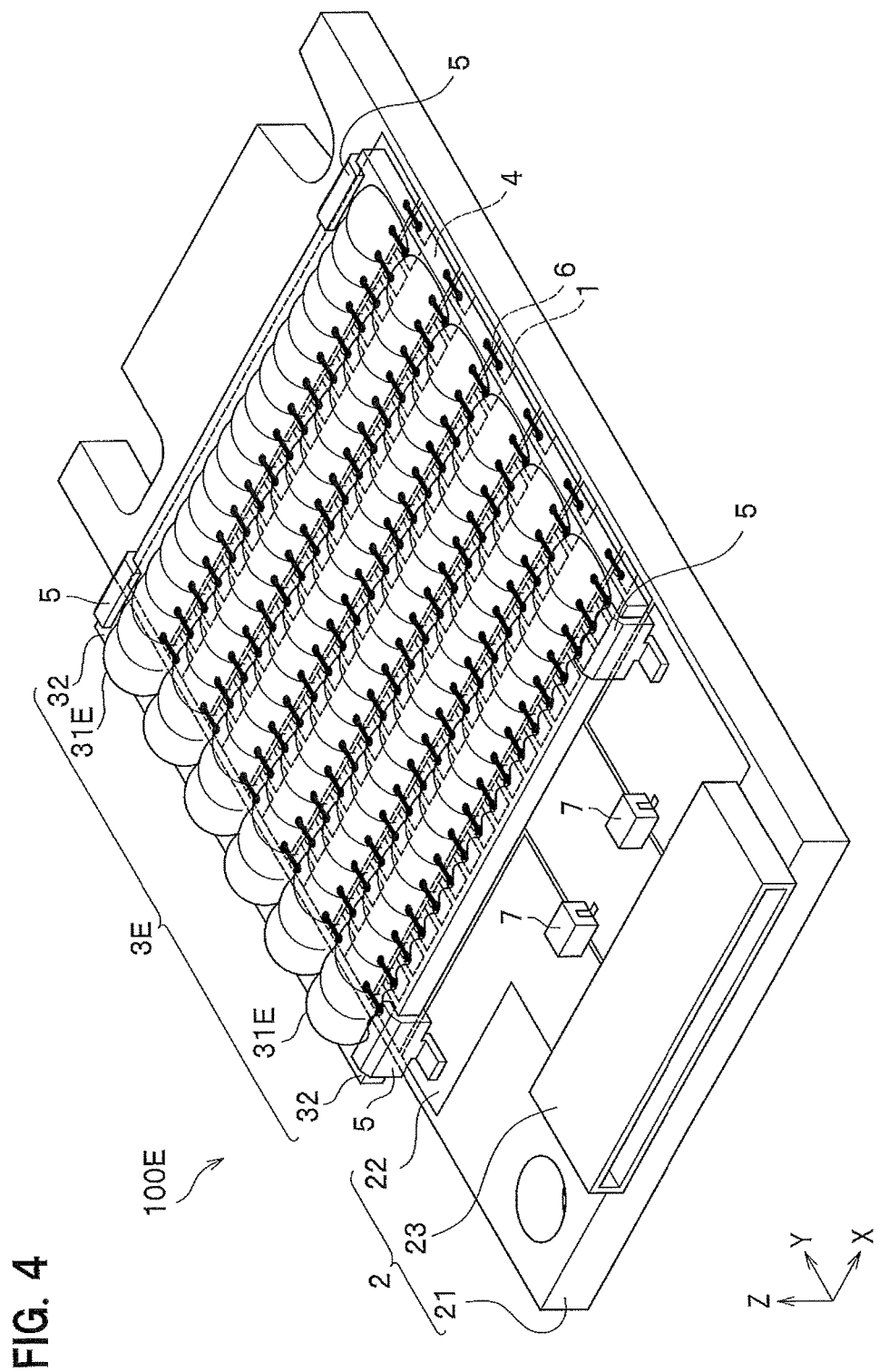
FIG. 4 is a schematic perspective diagram illustrating a modification of the first light-transmissive member in the light-emitting device according to the first embodiment.

A first light-transmissive member 3E according to a modification shown in FIG. 4 has a constitution that includes a fly-eye lens in which lenses 31E form a two-dimensional array, instead of the semicylindrical lenses 31 on the first light-transmissive member 3 shown in FIG. 1. The lenses 31E are semi-ellipsoidal convex lenses long in the Y-axis direction in a plan view. The arrangement pitches of the lenses 31E are the same as the arrangement pitches of the light-emitting elements 1 in the X-axis direction and the Y-axis direction. In other words, the lenses 31E each correspond to light-emitting elements 1, and the optical axes of the lenses 31E coincide with the optical axes of the corresponding light-emitting elements 1.

As described above, disposing the semi-ellipsoidal lenses 31E on the first light-transmissive member 3E enables adjustment of not only the light distribution properties in the Y-axis direction but the light distribution properties in the X-axis direction of the light-emitting elements 1.

Second Embodiment

A light-emitting device according to a second embodiment will be described referring to FIG. 5A.

A light-emitting device 100F according to the second embodiment further includes a second light-transmissive member 8 covering the light-emitting elements 1 in addition to components of the light-emitting device 100 according to the first embodiment.

The light-emitting device 100F has a constitution in which the second light-transmissive member 8 is provided in the gap between the mounting board 2 and the first light-transmissive member 3 to encapsulate the light-emitting elements 1.

The second light-transmissive member 8 is light transmissive and disposed for encapsulating the light-emitting elements 1, the wires 6, and other components on the upper surface of the mounting board 2 and in order to protect these components from dust, water, gases, and external force.

A material for the second light-transmissive member 8 preferably has a good light transmittance, weather resistance, and light resistance. For example, silicone resins, epoxy resins, and urea-resins can be preferably used. Such a resin material may contain wavelength conversion substances (e.g., phosphors), colorants, light-diffusing substances, and other fillers as appropriate. The second light-transmissive member 8 can be formed of inorganic materials such as glass and silica gel having good light resistance as well as a resin material.

The lower surface of the first light-transmissive member 3 in the present embodiment is separated from the light-emitting elements 1 in a direction perpendicular to a light extraction surface. The second light-transmissive member 8 encapsulates the upper surfaces and the lateral surfaces of the light-emitting elements 1. Also, when light-emitting elements having flat upper surfaces such as flip-chip type elements are used for the light-emitting elements 1, for example, the light-emitting elements 1 may be encapsulate by disposing the first light-transmissive member 3 so that its lower surface contacts the upper surfaces of the light-emitting elements 1 and covering the lateral surfaces of the light-emitting elements 1 with the second light-transmissive member 8.

The light-emitting device 100F has a constitution in which no air layer is present between the second light-transmissive member 8 and the first light-transmissive member 3. When the disposition of the second light-transmissive member 8 is intended to protect the light-emitting elements 1 and other components, the second light-transmissive member 8 may cover, preferably encapsulate, the light-emitting elements 1 and other components. Accordingly, the gap, in other words, the air layer may be present between the second light-transmissive member 8 and the first light-transmissive member 3. It is preferable, however, that no air layer be present between the mounting board 2 and the first light-transmissive member 3. The light-emitting device 100F preferably has a constitution in which it is difficult for a liquid resin material to flow out while the second light-transmissive member 8 is being poured between the mounting board 2 and the first light-transmissive member 3. To make a liquid resin material less likely to flow out, roughened surfaces or depressed portions can be formed, for example. The resin will puddle in the depressed portions. The roughened surfaces or the depressed portions are formed in certain areas on the upper surface of the mounting board 2, the areas being located below the edges of the first light-transmissive member 3. Such constitutions can reduce outpour of the liquid resin material to the outside.

An interface between media having different refractive indices reflects part of light. Accordingly, if the air layer is present between the second light-transmissive member 8 and the first light-transmissive member 3, part of the light from the light-emitting elements 1 is reflected by the interface between the second light-transmissive member 8 and the air layer, which is the gap, and by the interface between the air layer and the first light-transmissive member 3 or the second wiring 4. The larger the difference in the refractive indices of media on both sides of an interface is, the larger the amount of light reflected by the interface is.

By employing a constitution including no air layer between the second light-transmissive member 8 and the first light-transmissive member 3 or the second wiring 4, one of the interfaces through which the light from the light-emitting elements 1 passes is eliminated. Also, since the difference in refractive indices between a material such as resins and glass used for the second light-transmissive member 8 and the first light-transmissive member 3 or the second wiring 4 is smaller than the difference in refractive indices between the material and the air, the amount of light reflected by the interface is reduced. Accordingly, the light extraction efficiency can be enhanced by disposing the second light-transmissive member 8 so as to contact the lower surface of the first light-transmissive member 3 and/or the lower surface of the second wiring 4.

Subsequently, a method for manufacturing the light-emitting device 100F according to the second embodiment will be described.

The light-emitting device 100F can be manufactured by performing a step of forming the second light-transmissive member 8 (step of forming a second light-transmissive member) after the step of attaching the first light-transmissive member in the method for manufacturing the light-emitting device 100 according to the first embodiment.

In other words, after the first light-transmissive member 3 is attached to the mounting board 2, a liquid resin material is poured between the mounting board 2 and the first light-transmissive member 3 at the step of forming a second light-transmissive member to fully fill the gap between the mounting board 2 and the first light-transmissive member 3. In this case, excess of the liquid resin material is housed in the depressed portions, in which the resin puddle, in the mounting board 2. The resin material is then cured, so that the second light-transmissive member 8 is formed. The second light-transmissive member 8 thus encapsulates the light-emitting elements 1, the wires 6, and other components.

Also, the step of forming a second light-transmissive member may be performed integrally with the step of attaching the first light-transmissive member. In other words, after supplying the liquid resin material to the mounting board 2, the first light-transmissive member 3 is attached while the resin material is in the liquid state. The resin material is prepared to have an appropriate viscosity and to bulge so that the resin material will contact the first light-transmissive member 3 at that time. The resin material is then cured, so that the second light-transmissive member 8 is formed.

When the second light-transmissive member 8 is disposed so that a gap will be formed between the second light-transmissive member 8 and the first light-transmissive member 3, the step of forming a second light-transmissive member may be performed after the step of mounting light-emitting elements and before the step of attaching the first light-transmissive member.

In this case, the second light-transmissive member 8 can be formed by supplying the liquid resin material, for example by a potting method, to cover the light-emitting elements 1 and other components, and then curing the resin material.

Modification

A modification of the second light-transmissive member will be described referring to FIG. 5B.

Figure 5B:
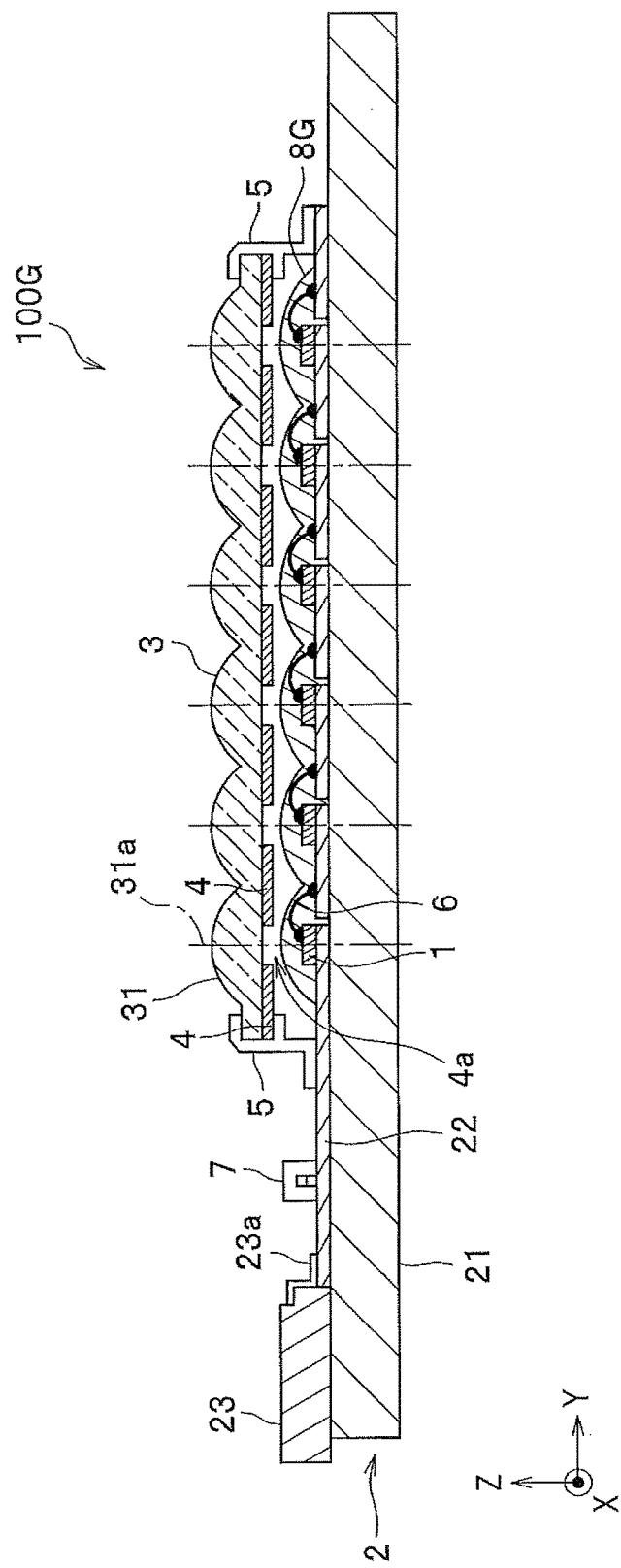
FIG. 5B is a schematic cross-sectional diagram illustrating a modification of a second light-transmissive member in the light-emitting device according to the second embodiment.

A second light-transmissive member 8G shown in FIG. 5B is formed to function as convex lenses corresponding to each of the light-emitting elements 1. The optical axes of the convex lenses preferably coincide with the optical axes of the corresponding light-emitting elements 1. Thus, the light distribution properties of a light-emitting device 100G can be better adjusted by a combination with the lenses on the first light-transmissive member 3.

The lenses formed as the second light-transmissive member 8G may be semicylindrical, hemispherical, or semi-ellipsoidal in shape. Alternatively, the first light-transmissive member 3 may be a flat plate without lenses, and the light distribution properties of the light-emitting elements 1 may be adjusted by the lens function of the second light-transmissive member 8G.

Third Embodiment

Next, a light-emitting device according to a third embodiment will be described referring to FIG. 6A and FIG. 6B.

Figure 6A:
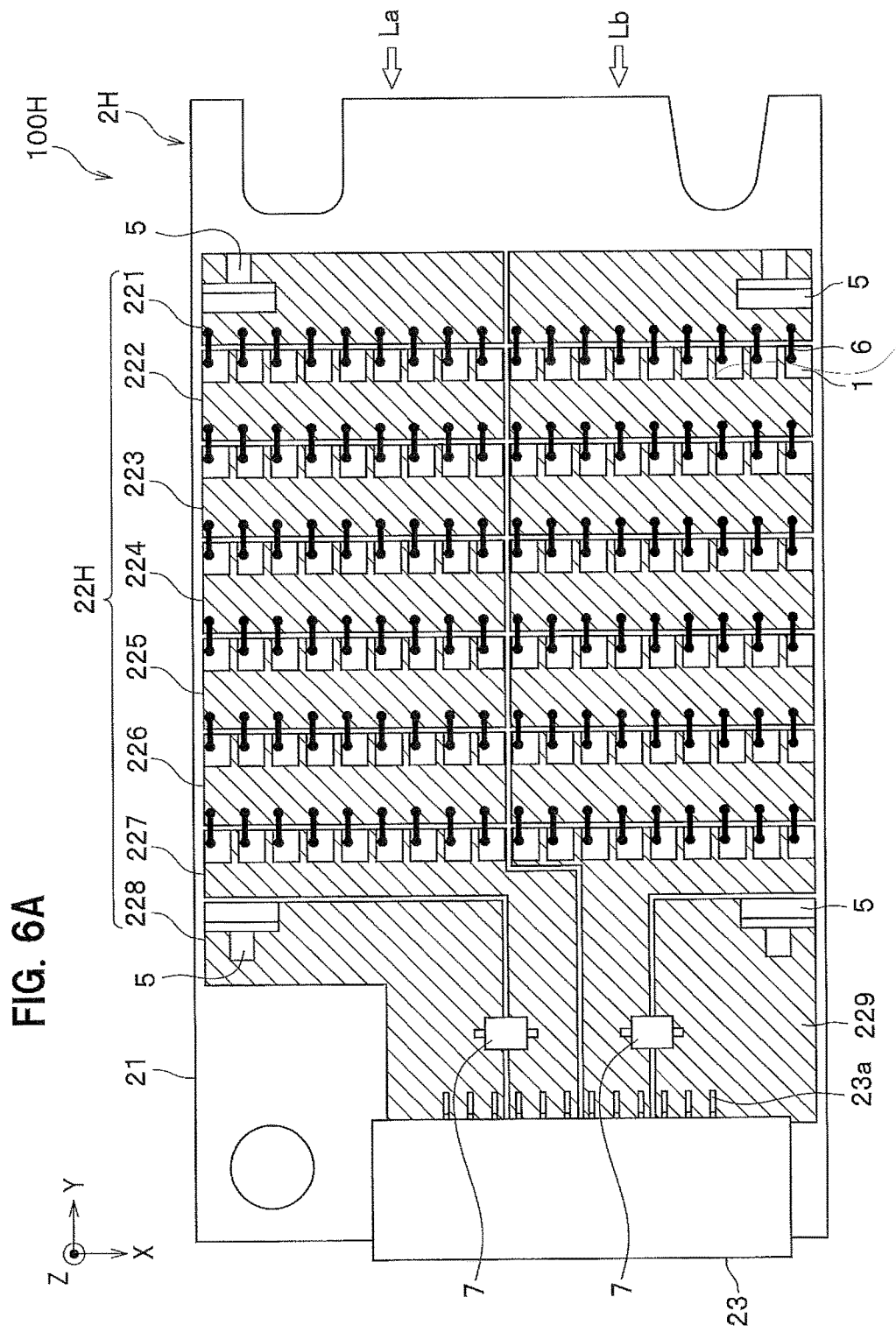
FIG. 6A is a schematic plan diagram illustrating a constitution of a light-emitting device according to a third embodiment without the first light-transmissive member.
Figure 6B:
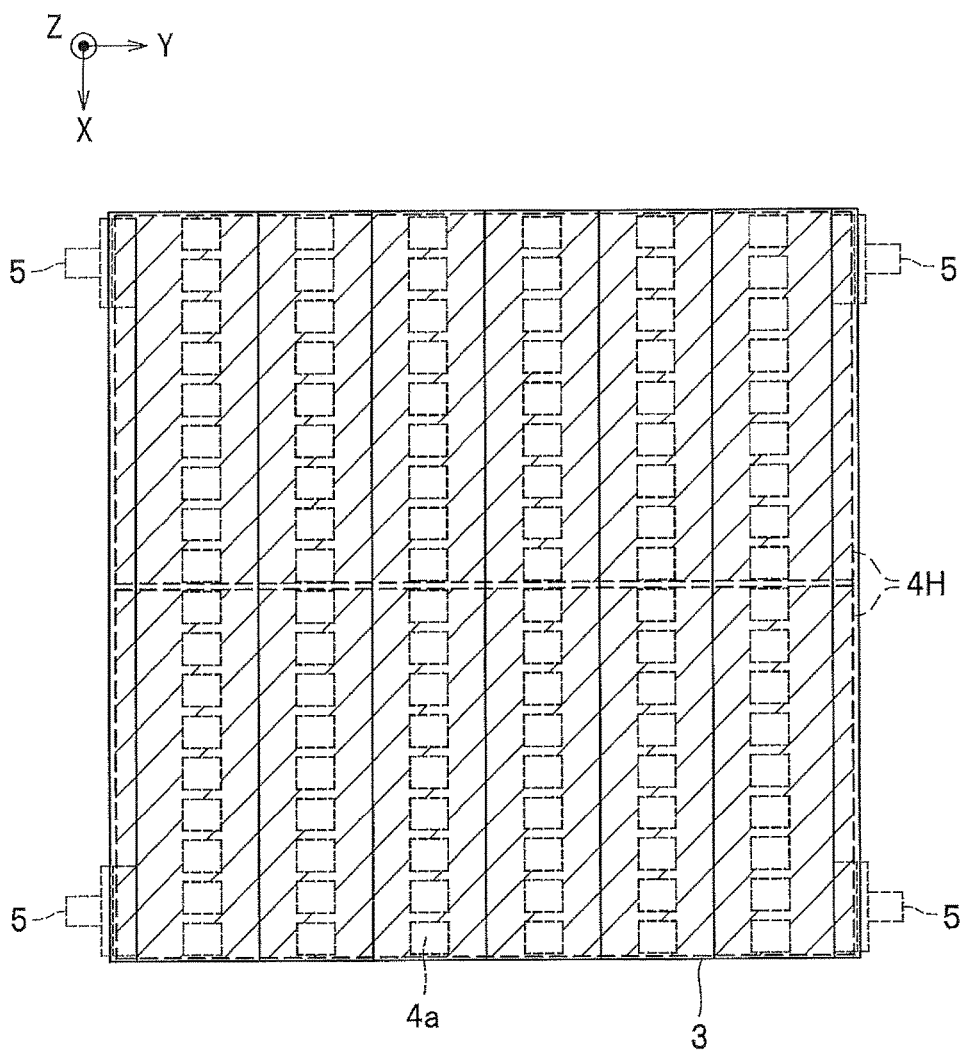
FIG. 6B is a schematic plan diagram illustrating a constitution of the first light-transmissive member in the light-emitting device according to the third embodiment.

FIG. 6A and FIG. 6B are plan diagrams. In FIG. 6A, hatched areas represent the first wiring. In FIG. 6B, hatched areas represent the second wiring.

In a light-emitting device 100H according to the third embodiment, first wiring 22H on a mounting board 2H and second wiring 4H are each divided into two in the X-axis direction. Each of the resulting two series of wiring are referred to as an a-column La and a b-column Lb. The light-emitting elements 1 on the a-column La and the light-emitting elements 1 on the b-column Lb can be independently controlled.

For this reason, the electrodes 221 to 227 of the first wiring 22H are each divided into two sections in the X-axis direction. Also, the second wiring 4H is also divided into two sections in the X-axis direction. Two supporting members 5 are provided to connect each of two divided sections of the electrode 221 to corresponding divided sections of the second wiring 4H, and two supporting members 5 are disposed to connect each of the electrodes 228 and 229 to the corresponding divided sections of the second wiring 4H.

When the light-emitting elements 1 are controlled in two systems of the a-column La and the b-column Lb, electrodes of one polarity, for example, electrodes of the cathode side, may be common. In this case, the second wiring 4H may not be divided into two sections and may have the same constitution as the second wiring 4 in the first embodiment.

The light-emitting device 100H operates in the same manner as the light-emitting device 100 in the first embodiment except that the light-emitting elements 1 can be controlled in two systems. Thus, the description of the operation is omitted.

Also, the description of the method for manufacturing the light-emitting device 100H is omitted because the light-emitting device 100H can be manufactured by the same method as the method for manufacturing the light-emitting device 100 except that shapes of the first wiring 22H and the second wiring 4H are different.

Fourth Embodiment

A light-emitting device according to a fourth embodiment will be described referring to FIG. 7A and FIG. 7B.

Figure 7A:
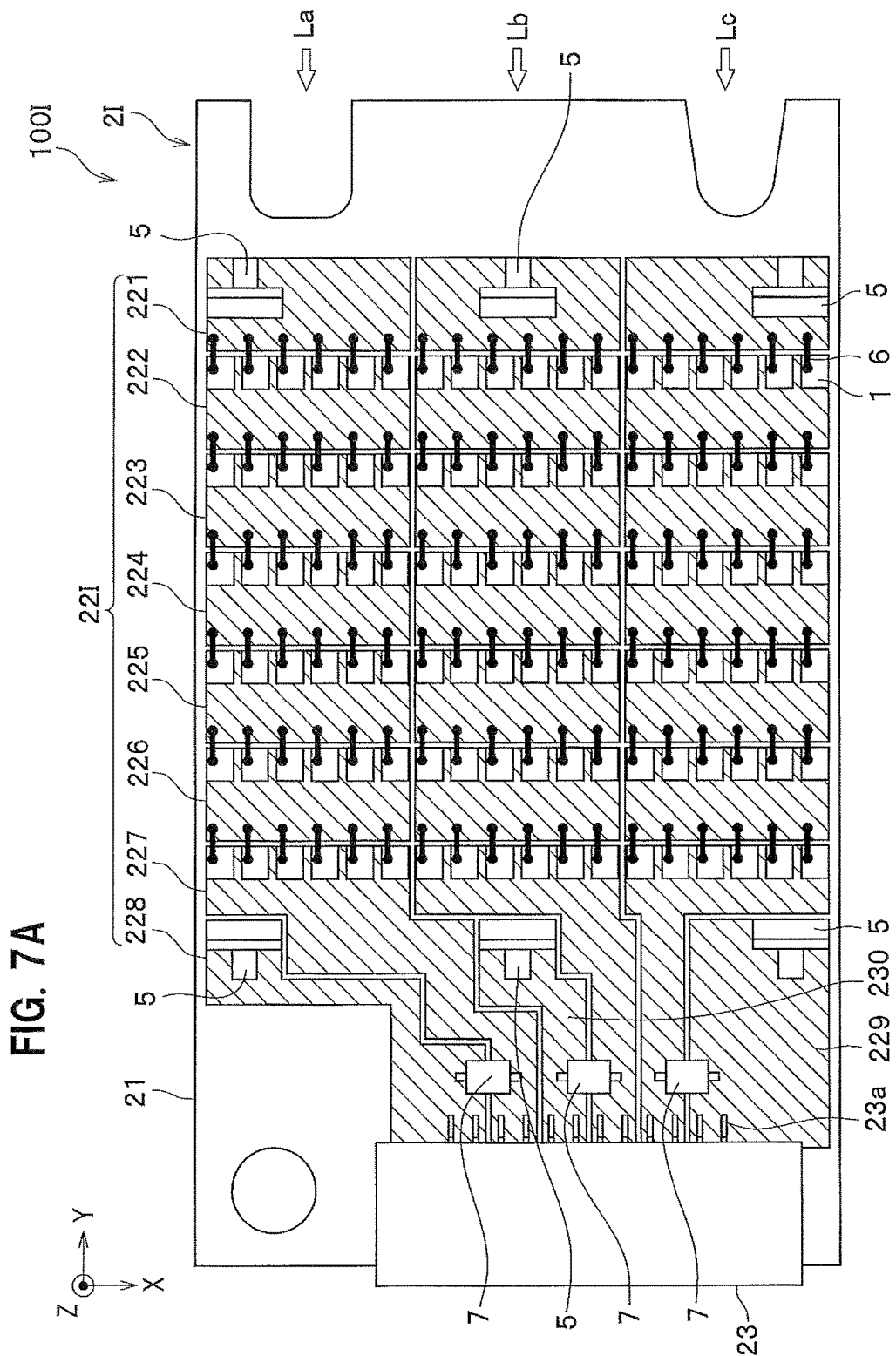
FIG. 7A is a schematic plan diagram illustrating a constitution of a light-emitting device according to a fourth embodiment without the first light-transmissive member.
Figure 7B:
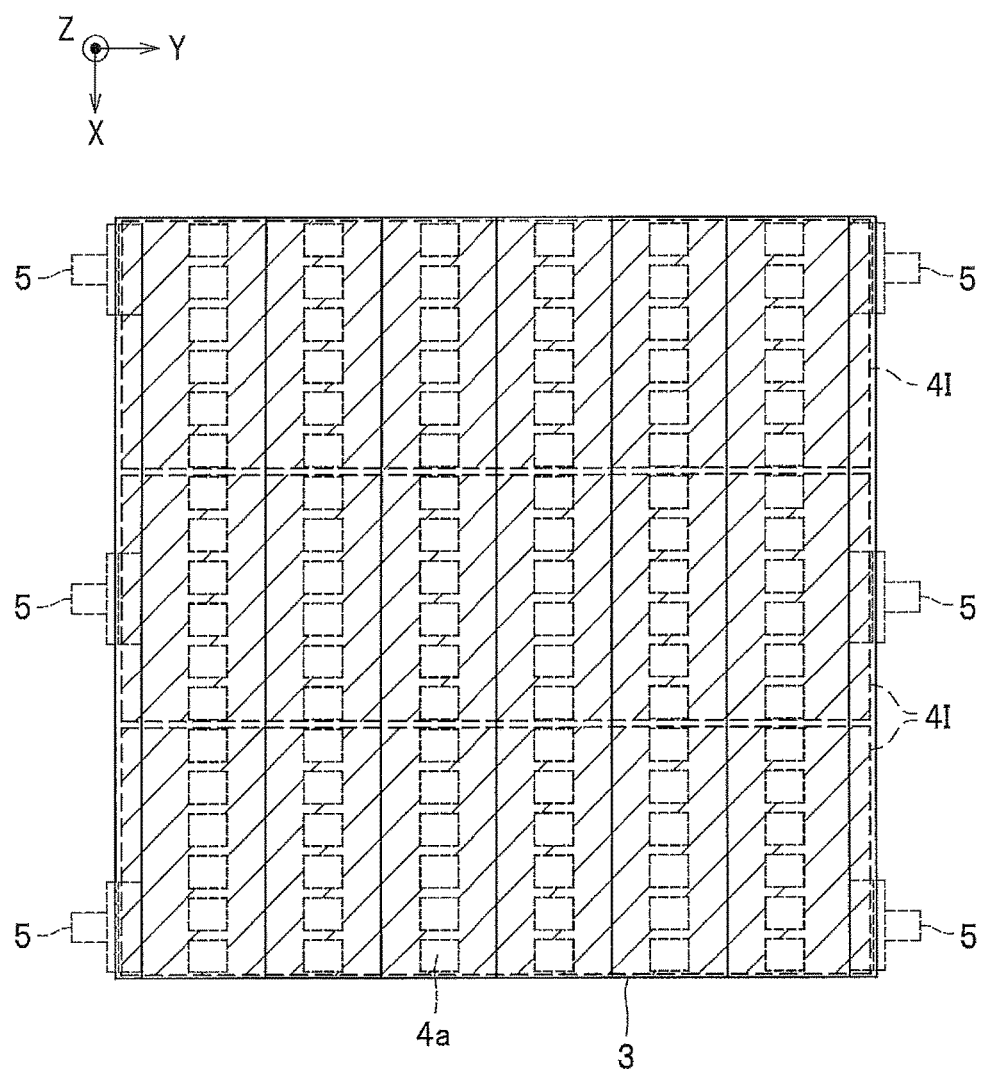
FIG. 7B is a schematic plan diagram illustrating a constitution of the first light-transmissive member in the light-emitting device according to the fourth embodiment.

FIG. 7A and FIG. 7B are plan diagrams. In FIG. 7A, hatched areas represent the first wiring. In FIG. 7B, hatched areas represent the second wiring.

In a light-emitting device 100I according to the fourth embodiment, first wiring 22I on a mounting board 2I and second wiring 4I are each divided into three in the X-axis direction. Each of the resulting three series of wiring are referred to as the a-column La, the b-column Lb, and a c-column Lc. The light-emitting elements 1 on the a-column La, the light-emitting elements 1 on the b-column Lb, and the light-emitting elements 1 on the c-column Lc can be independently controlled.

For this reason, the electrodes 221 to 227 of the first wiring 22I are each divided into three sections in the X-axis direction. An electrode 230 is disposed as a cathode corresponding to the b-column Lb of the first wiring 22I. The second wiring 4I is also divided into three sections in the X-axis direction. Three supporting members 5 are provided to connect each of three divided sections of the electrode 221 to corresponding divided sections of the second wiring 4I, and three supporting members 5 are provided to connect each of the electrodes 228, 229, and 230 to the corresponding divided sections of the second wiring 4I.

When the light-emitting elements 1 are controlled in three systems of the a-column La to the c-column Lc, electrodes of one polarity, for example, electrodes of the cathode side, may be common as in the third embodiment. In this case, a constitution may be employed in which the second wiring 4 in the first embodiment is used instead of the second wiring 4I. Also, the electrodes 228, 229, and 230 of the first wiring 22I on the cathode side may not be necessarily three but may be one or two.

The light-emitting device 100I operates in the same manner as the light-emitting device 100 in the first embodiment except that the light-emitting elements 1 can be controlled in three systems. Thus, the description of the operation is omitted.

The description of the method for manufacturing the light-emitting device 100I is omitted because the light-emitting device 100I can be manufactured by the same method as the method for manufacturing the light-emitting device 100 except that shapes of the first wiring 22I and the second wiring 4I are different.

The first wiring and the second wiring may be each divided into four or more sections. The first wiring and the second wiring may be divided so that the number of light-emitting elements 1 differ among the divided sections.

Example Application

Figure 8:
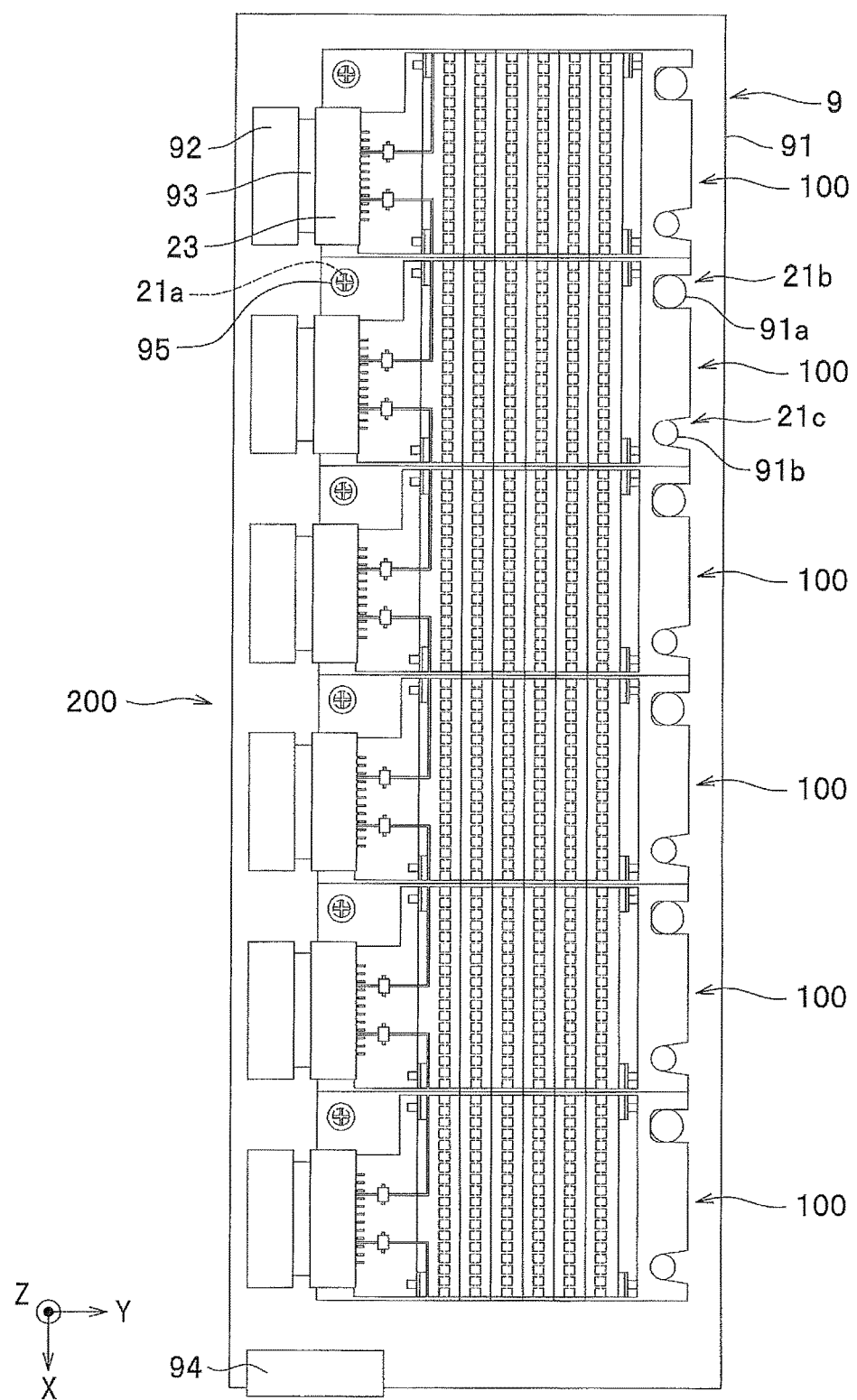
FIG. 8 is a schematic plan diagram illustrating a constitution of a light source unit in which the light-emitting devices according to the first embodiment are used.

An example application of the light-emitting device 100 according to the first embodiment will be described referring to FIG. 8.

This example application discloses a light source unit including a plurality of light-emitting devices 100.

A light source unit 200 has a constitution including a long mount 9 extending in the X-axis direction and the plurality of (e.g., six) light-emitting devices 100 aligned in a row on the mount 9.

The mount 9 includes a base 91, connectors 92, and a connector 94. The upper surface of the base 91 has projections 91a and 91b and screw holes. The projections 91a and 91b adopt the notches 21b and 21c of the mounting boards 2 and are used to position and attach the light-emitting devices 100. Screws 95 are inserted into the screw holes through the through holes 21a. Also, the connectors 92 to be connected to the connectors 23 of the respective light-emitting devices 100 are disposed on the upper surface of the base 91. Cables 93 connect corresponding connectors. In addition, the connector 94 to be connected to an external power supply is disposed on one end in the X-axis direction, which is the longitudinal direction of the base 91. The base 91 has a wiring pattern for attaching and connecting the connectors 92 and 94.

On the light-emitting devices 100, the light-emitting elements 1 are disposed to areas adjacent to the ends in the X-axis direction on the mounting boards 2. Accordingly, the light source unit 200 including the plurality of light-emitting devices 100 connected in the X-axis direction can reduce unevenness of the amount of light at the boundaries between the light-emitting devices 100, and thus can provide a linear lighting with less non-uniformity in luminance.

Also, the connectors 23 including positive and negative supply terminals of the light-emitting devices 100 are disposed on one end in a direction (i.e., Y-axis direction) substantially perpendicular to the direction of alignment (i.e., X-axis direction) of the light-emitting devices 100 in a plan view. In this constitution, the connectors 23 of the light-emitting devices 100 are aligned along one edge of the mount 9, and therefore, the wiring from the connectors 23 is less likely to be complicated on the light source unit 200.

When the light-emitting elements 1 mounted in the light-emitting devices 100 emit ultraviolet light, for example, the light source unit 200 can be suitably used for an ink dryer of a printer using an ink containing an ultraviolet-curable resin.

The light-emitting devices 100 according to the first embodiment can be replaced with the light-emitting devices according to the modifications of the first embodiment, the light-emitting devices according to the second to fourth embodiments, or the light-emitting devices according to the modifications of the second to fourth embodiments.

Also, exchange between or combination of components of the light-emitting devices according to the first to third embodiments is possible as appropriate.

For example, the first light-transmissive member 3E in the modification of the first embodiment can be used instead of the first light-transmissive member 3 in the light-emitting device according to another embodiment or a modification of the embodiment. The same applies to the first wiring 22 to 221 and the second wiring 4 to 4J. Also, the second light-transmissive member 8 or 8G in the second embodiment can apply to the light-emitting device according to another embodiment or a modification of the embodiment.

The above has specifically described the light-emitting devices according to the embodiments of the present invention, but the scope of the present invention is not limited to these descriptions and should be broadly interpreted on the basis of the claims. Needless to say, the scope of the present invention also includes various modifications based on these descriptions.

In a light-emitting device according to the embodiment of the present disclosure, a plurality of light-emitting elements can be disposed densely.

Obviously, numerous modifications and variations of the present invention are possible in light of the above teachings. It is therefore to be understood that within the scope of the appended claims, the invention may be practiced otherwise than as specifically described herein.

What is claimed is:

1. A light-emitting device comprising:
a mounting board;
a first wiring including a plurality of electrodes which are disposed away from each other on the mounting board;
a plurality of light-emitting elements provided on each of the plurality of electrodes on the mounting board and electrically connected to the first wiring;
a first light-transmissive member disposed above the plurality of light-emitting elements; and
a second wiring disposed on a lower surface of the first light-transmissive member and electrically connected to the first wiring through supporting members.

2. The light-emitting device according to claim 1, wherein the second wiring is further disposed on one or more lateral surfaces of the first light-transmissive member.

3. The light-emitting device according to claim 1, wherein the second wiring is disposed away from optical axes of the plurality of light-emitting elements in a plan view.

4. The light-emitting device according to claim 1, wherein the second wiring is light-transmissive.

5. The light-emitting device according to claim 1, wherein the second wiring is disposed away from each of areas overlapping each of the plurality of light-emitting elements in a plan view.

6. The light-emitting device according to claim 1, wherein the second wiring is disposed outside an area on which the plurality of light-emitting elements is mounted in a plan view.

7. The light-emitting device according to claim 1, further comprising:
a supply terminal on the mounting board electrically connected to the first wiring and the second wiring and connected to an external power supply.

8. The light-emitting device according to claim 7, wherein the supply terminal includes positive and negative electrodes.

9. The light-emitting device according to claim 1, wherein the first light-transmissive member includes at least one lens.

10. The light-emitting device according to claim 9, wherein the plurality of light-emitting elements is arranged in one or more rows in a plan view, and
wherein the one or more lenses are in semicylindrical shapes extending in one direction, and correspond to the one or more rows.

11. The light-emitting device according to claim 9, wherein the plurality of light-emitting elements is two-dimensionally arranged along a predetermined direction and a direction substantially perpendicular to the predetermined direction in a plan view, and
wherein each of the lenses is in a convex lens shape corresponding to each of the plurality of light-emitting elements in the predetermined direction and the direction substantially perpendicular to the predetermined direction.

12. The light-emitting device according to claim 1, wherein the plurality of light-emitting elements is separated from the first light-transmissive member in a direction perpendicular to a light extraction surface of the plurality of light emitting element.

13. A light-emitting device comprising:
a mounting board;
a first wiring including a plurality of electrodes which are disposed away from each other on the mounting board;
a plurality of light-emitting elements provided on each of the plurality of electrodes on the mounting board and electrically connected to the first wiring;
a first light-transmissive member disposed above the plurality of light-emitting elements; and
a second wiring disposed on one or more lateral surfaces of the first light-transmissive member and electrically connected to the first wiring through supporting members.

14. A light-emitting device comprising:
a mounting board;
a first wiring including a plurality of electrodes which are disposed away from each other on the mounting board;
a plurality of light-emitting elements provided on each of the plurality of electrodes on the mounting board and electrically connected to the first wiring;
a first light-transmissive member disposed above the plurality of light-emitting elements;
a second wiring disposed on a lower surface of the first light-transmissive member and electrically connected to the first wiring through supporting members; and
a second light-transmissive member encapsulating the plurality of light-emitting elements,
wherein the first light-transmissive member covers the plurality of light-emitting elements and the second light-transmissive member.

15. The light-emitting device according to claim 14, wherein the second light-transmissive member is in contact with the first light-transmissive member.

* * * * *